United States Patent
Hashimoto et al.

(10) Patent No.: US 11,079,679 B2
(45) Date of Patent: Aug. 3, 2021

(54) SUBSTRATE PROCESSING METHOD AND RECORDING MEDIUM CAPABLE OF SUPPRESSING NON-UNIFORMITY IN DEGREE OF PROGRESSION OF PROCESSING DEPENDING ON POSITION ON SUBSTRATE

(71) Applicant: Tokyo Electron Limited, Tokyo (JP)

(72) Inventors: Yusaku Hashimoto, Koshi (JP);
Takeshi Shimoaoki, Koshi (JP);
Masahiro Fukuda, Koshi (JP);
Kouichirou Tanaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/656,925

(22) Filed: Oct. 18, 2019

(65) Prior Publication Data
US 2020/0050111 A1 Feb. 13, 2020

Related U.S. Application Data

(62) Division of application No. 15/823,847, filed on Nov. 28, 2017, now abandoned.

(30) Foreign Application Priority Data

| Dec. 2, 2016 | (JP) | JP2016-235297 |
| May 15, 2017 | (JP) | JP2017-096632 |
| Sep. 20, 2017 | (JP) | JP2017-180543 |

(51) Int. Cl.
*G03F 7/30* (2006.01)
*G03F 7/16* (2006.01)
(Continued)

(52) U.S. Cl.
CPC ........... *G03F 7/3021* (2013.01); *B05D 1/002* (2013.01); *B05D 1/40* (2013.01); *G03F 7/162* (2013.01); *B05D 1/26* (2013.01)

(58) Field of Classification Search
CPC ....... G03F 7/3021; G03F 7/162; B05D 1/002; B05D 1/40; B05D 1/26
See application file for complete search history.

(56) References Cited

U.S. PATENT DOCUMENTS

| 5,740,488 | A | 4/1998 | Fujimoto | |
| 2010/0151126 | A1* | 6/2010 | Iseki | B05D 1/005 427/240 |

(Continued)

FOREIGN PATENT DOCUMENTS

| JP | 2015-053467 A | 3/2015 |
| JP | 2016-011345 A | 1/2016 |

*Primary Examiner* — Dah-Wei D. Yuan
*Assistant Examiner* — Kristen A Dagenais-Englehart
(74) *Attorney, Agent, or Firm* — Pearne & Gordon LLP

(57) ABSTRACT

A method includes forming a liquid puddle of a mixed solution of the diluting liquid and the processing liquid; rotating the substrate at a first rotation speed which allows the mixed solution located at a region facing an inner side than an edge of the liquid contact surface to stay between the liquid contact surface and the surface of the substrate and allows the mixed solution located at a region facing an outer side than the edge of the liquid contact surface to be diffused toward an edge of the substrate; rotating the substrate at a second rotation speed smaller than the first rotation speed after the substrate is rotated at the first rotation speed; and moving the nozzle toward the edge of the substrate while discharging the processing liquid from the discharge hole in a state that the substrate is rotated at the second rotation speed.

18 Claims, 20 Drawing Sheets

(51) Int. Cl.
*B05D 1/00* (2006.01)
*B05D 1/40* (2006.01)
*B05D 1/26* (2006.01)

(56) References Cited

U.S. PATENT DOCUMENTS

| | | | |
|---|---|---|---|
| 2015/0036110 A1* | 2/2015 | Yoshihara | G03F 7/30 |
| | | | 355/27 |
| 2016/0154311 A1* | 6/2016 | Muta | G03F 7/3021 |
| | | | 430/434 |
| 2016/0209748 A1 | 7/2016 | Hasimoto | |
| 2017/0090292 A1 | 3/2017 | Kubota | |
| 2017/0102616 A1 | 4/2017 | Hashimoto | |

* cited by examiner

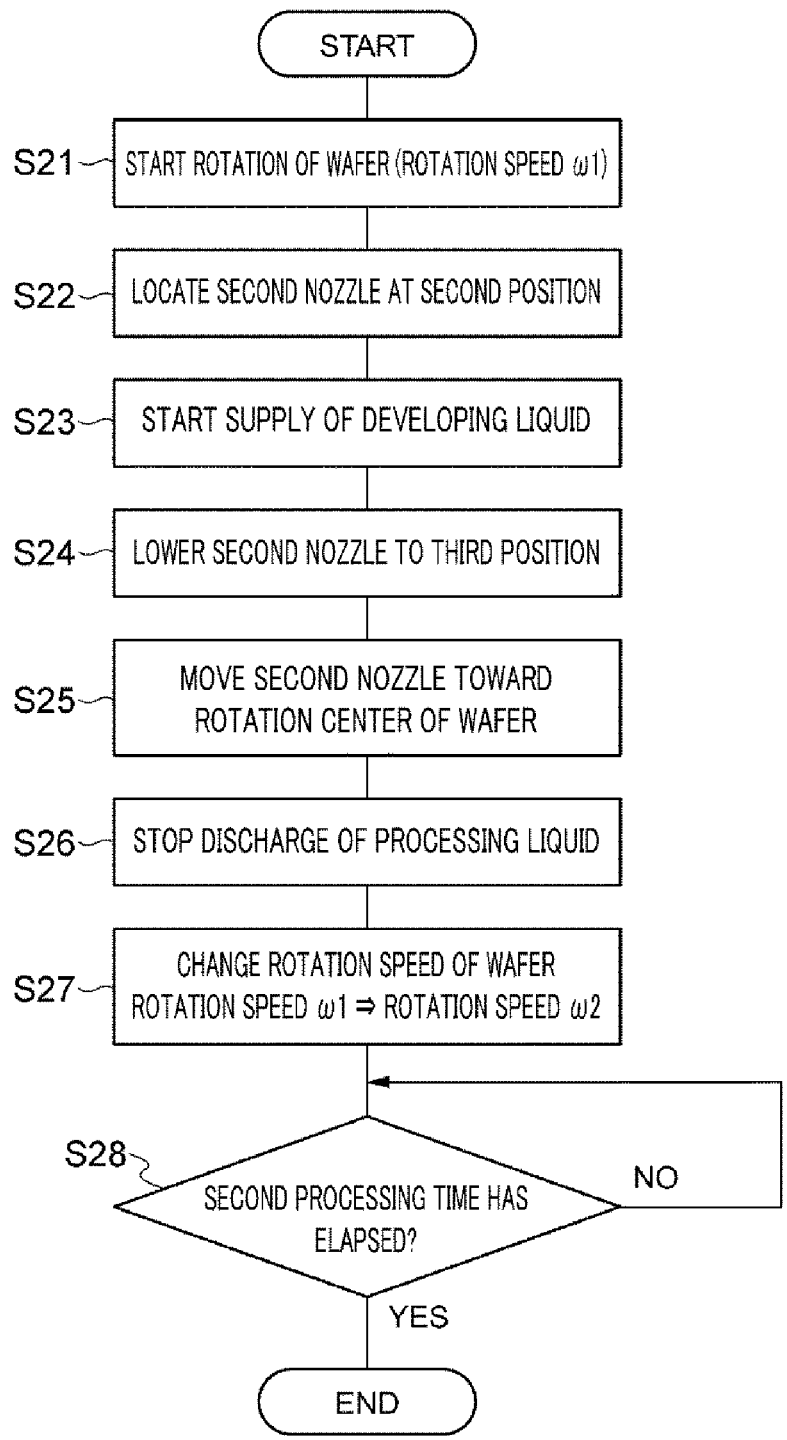

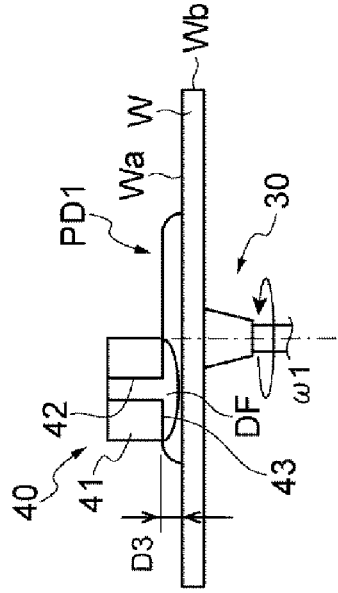
FIG. 14A
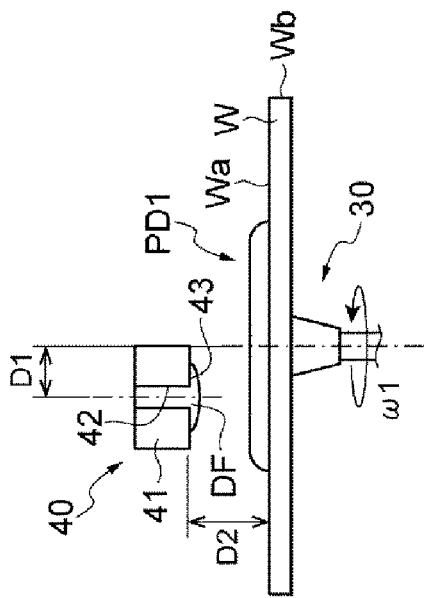
FIG. 14B
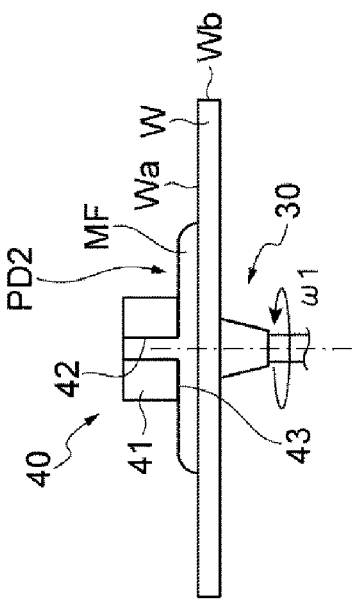
FIG. 14C
FIG. 14D

SUBSTRATE PROCESSING METHOD AND RECORDING MEDIUM CAPABLE OF SUPPRESSING NON-UNIFORMITY IN DEGREE OF PROGRESSION OF PROCESSING DEPENDING ON POSITION ON SUBSTRATE

CROSS-REFERENCE TO RELATED APPLICATION

This is a divisional application of U.S. patent application Ser. No. 15/823,847, filed on Nov. 28, 2017, which claims the benefit of Japanese Patent Application Nos. 2016-235297, 2017-096632 and 2017-180543 filed on Dec. 2, 2016, May 15, 2017 and Sep. 20, 2017, respectively, the entire disclosures of which are incorporated herein by reference.

TECHNICAL FIELD

The embodiments described herein pertain generally to a substrate processing apparatus, a substrate processing method and a recording medium.

BACKGROUND

Disclosed in Patent Document 1 is a substrate processing method including a liquid puddle forming process of forming a liquid puddle of a diluted developing liquid which is diluted with pure water; a liquid film forming process of forming a liquid film of the diluted developing liquid by diffusing the liquid puddle of the diluted developing liquid on an entire surface of a substrate through the rotation of the substrate at a first rotation speed; and a developing liquid supplying process of supplying a developing liquid onto the substrate. In the developing liquid supplying process, while rotating the substrate at a second rotation speed smaller than the first rotation speed and forming the liquid puddle of the developing liquid between the substrate and a liquid contact surface of a nozzle by supplying the developing liquid from the nozzle, the nozzle is moved in a diametrical direction which passes through a center of the substrate.

Patent Document 1: Japanese Patent Laid-open Publication No. 2016-011345

SUMMARY

Exemplary embodiments provide a substrate processing apparatus, a substrate processing method and a recording medium capable of suppressing non-uniformity in a degree of progression of a processing depending on a position on a substrate.

In an exemplary embodiment, a substrate processing apparatus includes a rotating/holding unit configured to hold and rotate a substrate; a first supply unit configured to supply a diluting liquid on a surface of the substrate; a second supply unit configured to supply a processing liquid on the surface of the substrate; and a control unit. The second supply unit includes a nozzle having a liquid contact surface facing the surface of the substrate and a discharge hole which is opened at the liquid contact surface and through which the processing liquid is discharged; and a position adjusting unit configured to adjust a position of the nozzle. The control unit is configured to perform controlling the first supply unit to supply the diluting liquid on the surface of the substrate and to form a liquid puddle of the diluting liquid; controlling the second supply unit to bring the liquid contact surface into contact with the liquid puddle of the diluting liquid by moving the nozzle through the position adjusting unit and to form a liquid puddle of a mixed solution of the diluting liquid and the processing liquid by discharging the processing liquid from the discharge hole; controlling the rotating/holding unit to rotate the substrate at a first rotation speed which allows the mixed solution located at an inner side than an edge of the liquid contact surface to stay between the liquid contact surface and the surface of the substrate and allows the mixed solution located at an outer side than the edge of the liquid contact surface to be diffused toward an edge of the substrate; controlling the rotating/holding unit to rotate the substrate at a second rotation speed smaller than the first rotation speed after the substrate is rotated at the first rotation speed; and controlling the second supply unit to move the nozzle toward the edge of the substrate by the position adjusting unit while rotating the substrate at the second rotation speed and discharging the processing liquid from the discharge hole.

On the surface of the substrate, the degree of the progression of the processing by the processing liquid tends to be increased at a portion where the processing liquid first reaches, as compared to other portions. In the substrate processing apparatus, however, prior to supplying the processing liquid, the liquid puddle of the mixed solution is formed and the substrate is rotated at the first rotation speed in the state that the liquid contact surface is in contact with the liquid puddle of the mixed solution. Accordingly, while the mixed solution located at the inner side (hereinafter, referred to as "inner region") than the edge of the liquid contact surface stays between the liquid contact surface and the surface of the wafer, the mixed solution located at the outer side (hereinafter, referred to as "outer region") than the edge of the liquid contact surface is diffused toward the edge of the substrate. As a result, a mixed solution layer, whose thickness at the inner region is larger than at the outer region, is formed. The mixed solution layer is degraded as time elapses. The degraded mixed solution layer hampers the progression of the processing by the processing liquid supplied afterwards. As stated above, as compared to the outer region, the thick mixed solution layer exists at the inner region. Therefore, the progression of the processing at the portion (hereinafter, referred to as "initial arrival portion") where the processing liquid first reaches after the mixed solution layer is formed is slowed down. Therefore, a difference between the degree of the progression of the processing at the initial arrival portion and the degree of the progression of the processing at the rest portion is reduced. Hence, non-uniformity in the degree of the progression of the processing (hereinafter, referred to as "processing progression degree") depending on the position on the substrate can be suppressed.

The controlling of the second supply unit to bring the liquid contact surface into contact with the liquid puddle of the diluting liquid by moving the nozzle through the position adjusting unit may include controlling the second supply unit to move the nozzle close to the surface of the substrate by the position adjusting unit in a state that the discharge hole is filled with the processing liquid. In this case, by suppressing air bubbles from being mixed into the liquid puddle of the mixed solution, the non-uniformity in the processing progression degree that might be caused by the air bubbles can be suppressed.

The controlling of the second supply unit to move the nozzle close to the surface of the substrate in the state that the discharge hole is filled with the processing liquid may include controlling the second supply unit to move the nozzle close to the surface of the substrate by the position adjusting unit while discharging the processing liquid from the discharge hole. In this case, the processing liquid is mixed into the diluting liquid immediately after the liquid contact surface is brought into contact with the diluting liquid. Accordingly, the formation of the liquid puddle of the mixed solution is accelerated, so that the processing time can be shortened.

The controlling of the second supply unit to move the nozzle close to the surface of the substrate while discharging the processing liquid from the discharge hole may include controlling the second supply unit to move the nozzle close to the surface of the substrate until a distance between the liquid contact surface and the surface of the substrate becomes 0.5 mm to 2 mm after the discharging of the processing liquid from the discharge hole is begun in a state that the distance between the liquid contact surface and the surface of the substrate is 5 mm to 7 mm. In this case, the processing liquid can be suppressed from being dropped down until the liquid contact surface comes into contact with the liquid puddle of the diluting liquid after the discharging of the processing liquid from the discharge hole is begun. Accordingly, the progression of the processing by the dropped processing liquid can be suppressed, so that the non-uniformity in the processing progression degree that might be caused by this drop can be suppressed.

The first rotation speed may be in a range from 300 rpm to 1500 rpm.

The second rotation speed may be in a range from 10 rpm to 100 rpm. In moving the nozzle while discharging the processing liquid from the discharge hole, the processing liquid and the mixed solution may be distributed in a spiral shape while being alternately arranged from the rotation center of the substrate toward the edge thereof. In this case, a difference in the processing progression degree between a region in contact with the processing liquid and a region in contact with the mixed solution is increased. By setting the second rotation speed to be equal to or higher than 10 rpm, however, the diffusion of the mixed solution is accelerated, so that the formation of the spiral-shaped distribution can be suppressed. Further, by setting the second rotation speed to be equal to or lower than 100 rpm, an excessive increase of the processing progression degree at the rotation center of the substrate can be suppressed.

The control unit may be configured to further perform controlling the rotating/holding unit to rotate the substrate at a third rotation speed smaller than the first rotation speed when the second supply unit brings the liquid contact surface into contact with the liquid puddle of the diluting liquid by moving the nozzle through the position adjusting unit and discharges the processing liquid from the discharge hole.

The controlling of the second supply unit to bring the liquid contact surface into contact with the liquid puddle of the diluting liquid by moving the nozzle through the position adjusting unit may include controlling the second supply unit to bring the liquid contact surface into contact with the liquid puddle of the diluting liquid at a position where a center of the liquid contact surface is deviated from a rotation center of the substrate. Further, the controlling of the second supply unit to form the liquid puddle of the mixed solution of the diluting liquid and the processing liquid by discharging the processing liquid from the discharge hole may include controlling the second supply unit to move the center of the liquid contact surface close to the rotation center of the substrate by moving the nozzle through the position adjusting unit while discharging the processing liquid from the discharge hole. In this case, immediately after the discharging of the processing liquid from the discharge hole is begun, the processing liquid is spread in the rotation direction of the substrate. Further, by moving the nozzle toward the rotation center of the substrate, the processing liquid is also spread in a diametrical direction (direction passing through the rotation center). Accordingly, it is possible to rapidly form the liquid puddle of the processing liquid, which has higher uniformity of concentration, so that the non-uniformity in the processing progression degree that might be caused by the non-uniformity in the concentration of the processing liquid can be suppressed.

The third rotation speed may be equal to or less than 100 rpm.

The controlling of the second supply unit to move the nozzle toward the edge of the substrate by the position adjusting unit while rotating the substrate at the second rotation speed and discharging the processing liquid from the discharge hole may include controlling the second supply unit such that the second rotation speed and a moving speed of the nozzle satisfy a following expression:

$$3 \leq RF/V \leq 5$$

(V denotes the moving speed [mm/s] of the nozzle and RF denotes the second rotation speed [rpm]).

By setting RF/V to be equal to or larger than 3, the formation of the aforementioned spiral-shaped distribution can be suppressed. Further, by setting RF/V to be equal to or smaller than 5, the excessive increase of the processing progression degree at the rotation center of the substrate can be suppressed. Thus, the non-uniformity in the processing progression degree can be further suppressed.

The controlling of the second supply unit to move the nozzle toward the edge of the substrate by the position adjusting unit while rotating the substrate at the second rotation speed and discharging the processing liquid from the discharge hole may include controlling the second supply unit to increase a discharge amount of the processing liquid from the discharge hole while the nozzle is being moved toward the edge of the substrate. In this case, by setting the processing progression degree at the rotation center of the substrate to be relatively small, the non-uniformity in the processing progression degree can be further suppressed.

In another exemplary embodiment, a substrate processing method may include supplying a diluting liquid on a surface of a substrate and forming a liquid puddle of the diluting liquid; bringing, by moving a nozzle having a liquid contact surface facing the surface of the substrate and a discharge hole which is opened at the liquid contact surface and through which a processing liquid is discharged, the liquid contact surface into contact with the liquid puddle of the diluting liquid, and forming a liquid puddle of a mixed solution of the diluting liquid and the processing liquid by discharging the processing liquid from the discharge hole; rotating the substrate at a first rotation speed which allows the mixed solution located at an inner side than an edge of the liquid contact surface to stay between the liquid contact surface and the surface of the substrate and allows the mixed solution located at an outer side than the edge of the liquid contact surface to be diffused toward an edge of the substrate; rotating the substrate at a second rotation speed smaller than the first rotation speed after the substrate is rotated at the first rotation speed; and moving the nozzle toward the edge of the substrate while discharging the processing liquid from the discharge hole in a state that the substrate is rotated at the second rotation speed.

In still another exemplary embodiment, there is provided a computer-readable recording medium having stored thereon computer-executable instructions that, in response to execution, cause an apparatus to perform a substrate processing method as stated above.

According to the exemplary embodiments, it is possible to provide the substrate processing apparatus and the substrate processing method capable of suppressing the non-uniformity in the processing progression degree depending on the position on the substrate, and the recording medium therefor.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 13 is a flowchart for describing a sequence of a pre-wet processing;

FIG. 14A to FIG. 14D are schematic diagrams illustrating states of the substrate while performing the pre-wet processing;

DETAILED DESCRIPTION

Figure 1:
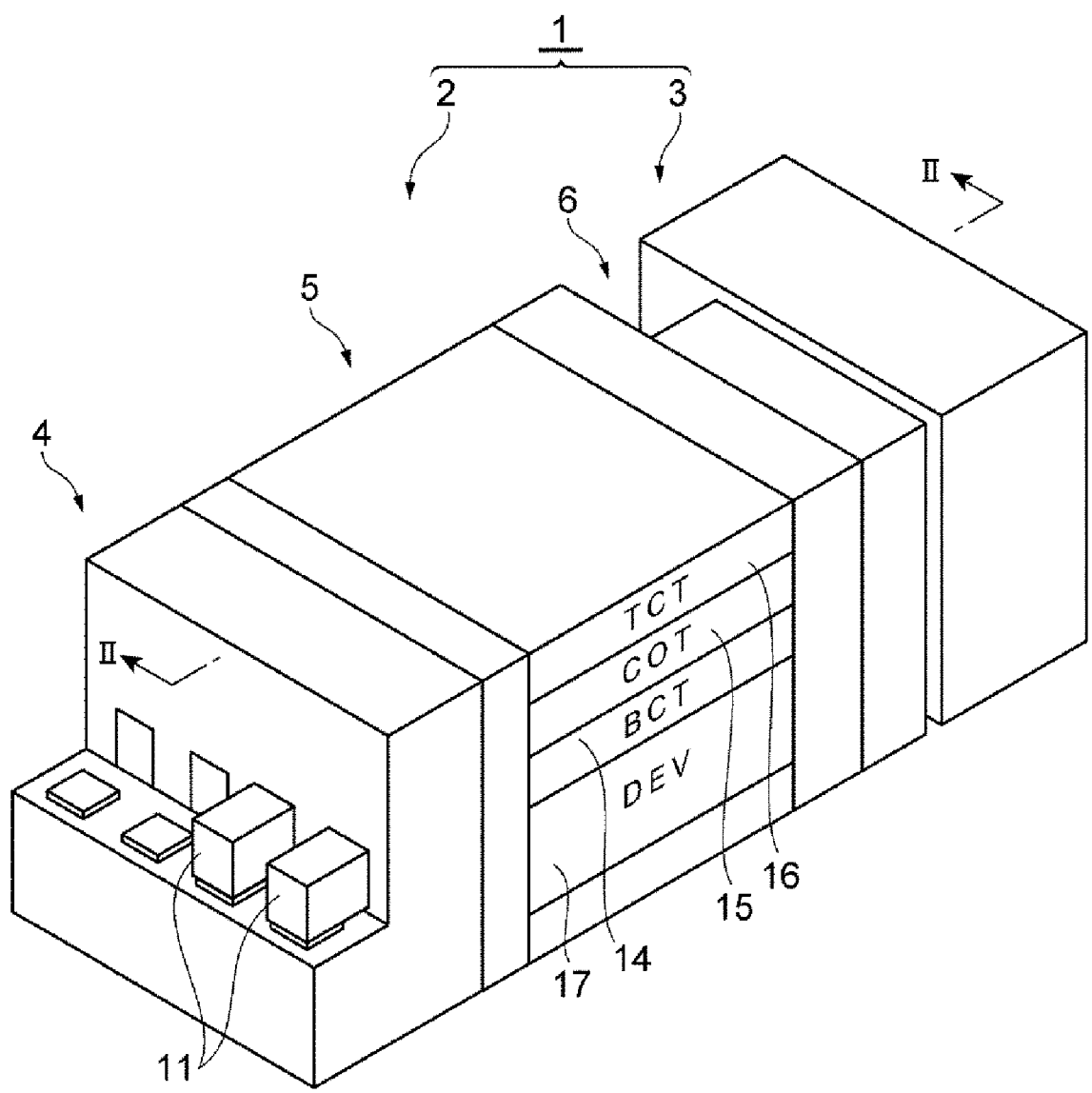
FIG. 1 is a perspective view illustrating a schematic configuration of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described in detail with reference to the accompanying drawings. In the description, same parts or parts having same functions will be assigned same reference numerals, and redundant description will be omitted.

[Substrate Processing System]

A substrate processing system 1 is a system configured to perform formation of a photosensitive film on a substrate, exposure of the corresponding photosensitive film and development of the corresponding photosensitive film. The substrate as a processing target is, for example, a semiconductor wafer W. The photosensitive film is, by way of non-limiting example, a resist film. The substrate processing system 1 includes a coating and developing apparatus 2 and an exposure apparatus 3. The exposure apparatus 3 is configured to perform an exposure processing of the resist film (photosensitive film) formed on the wafer W (substrate). To elaborate, the exposure apparatus 3 irradiates an energy beam to an exposure target portion of the resist film by an immersion exposure method or the like. The coating and developing apparatus 2 is configured to perform a processing of forming the resist film on a surface of the wafer W (substrate) prior to the exposure processing by the exposure apparatus 3 and perform a developing processing of the resist film after the exposure processing.

[Substrate Processing Apparatus]

Figure 2:
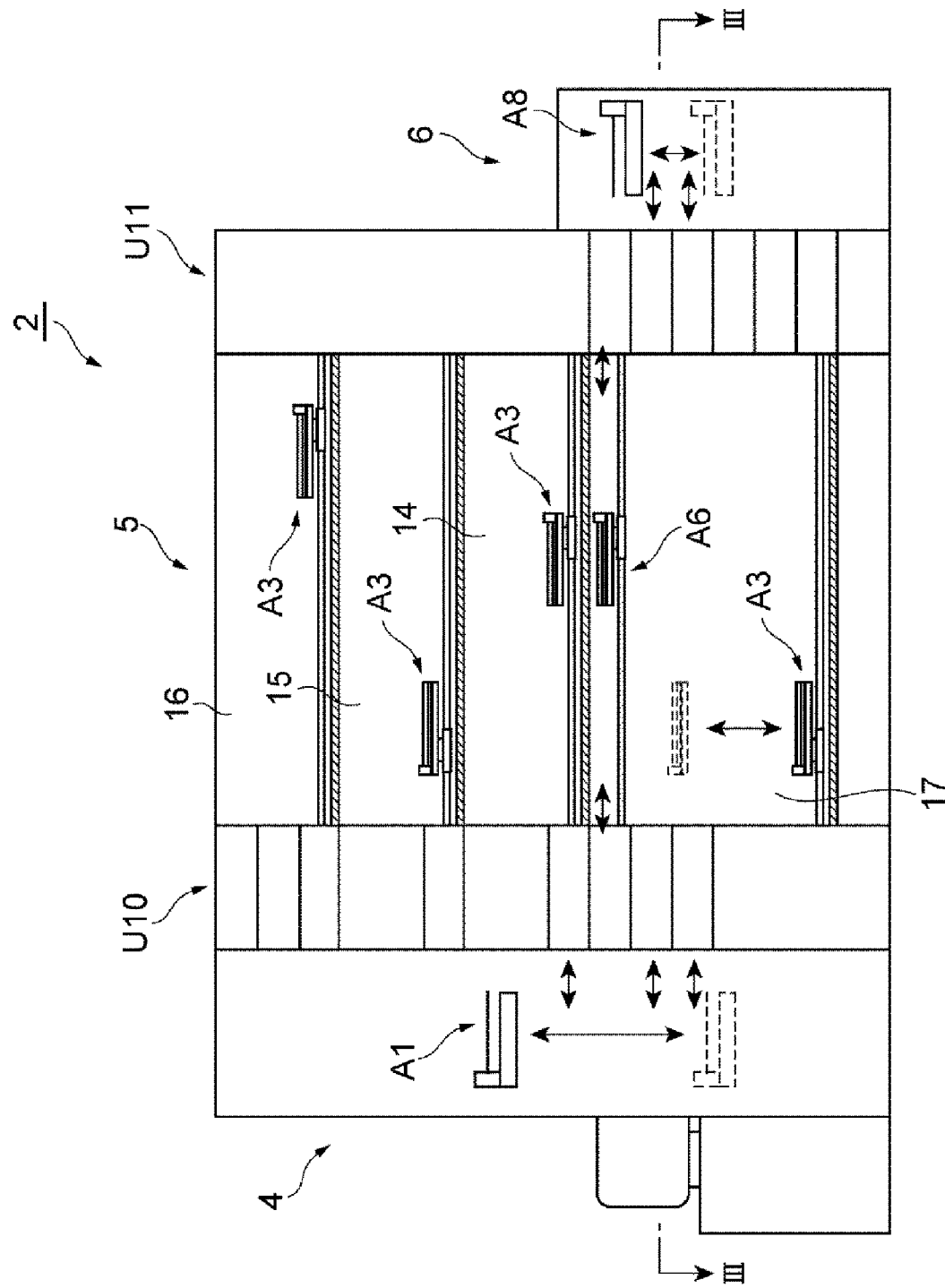
FIG. 2 is a cross sectional view taken along a line II-II of FIG. 1.
Figure 3:
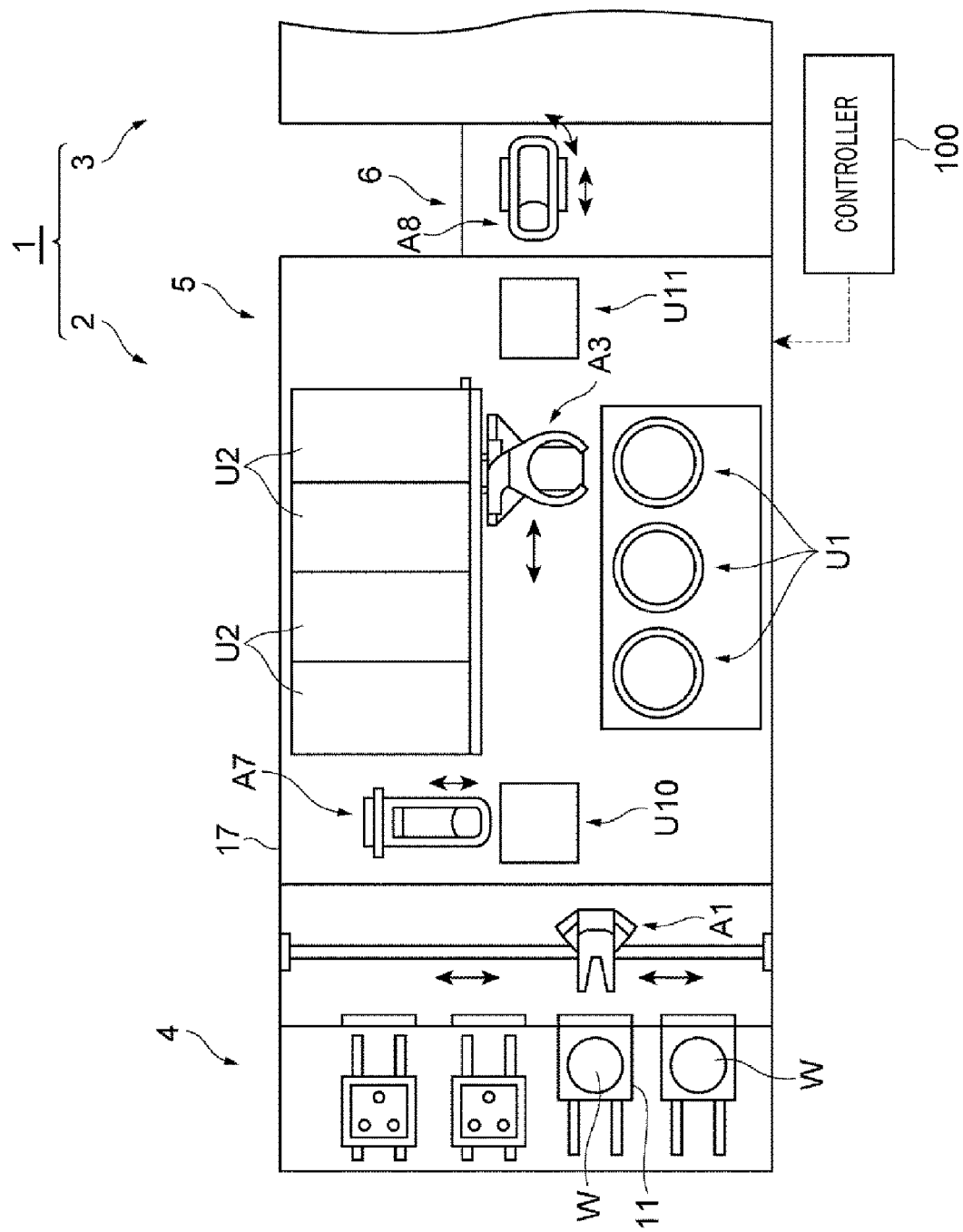
FIG. 3 is a cross sectional view taken along a line III-III of FIG. 2.

Hereinafter, a configuration of the coating and developing apparatus 2 as an example of a substrate processing apparatus will be explained. As depicted in FIG. 1 to FIG. 3, the coating and developing apparatus 2 is equipped with a carrier block 4, a processing block 5, an interface block 6 and a controller 100 (control unit).

The carrier block 4 is configured to carry a wafer W into/from the coating and developing apparatus 2. For example, the carrier block 4 is configured to support a multiple number of carriers 11 for wafers W and incorporates therein a delivery arm A1. Each carrier 11 is configured to accommodate therein, for example, a plurality of circular wafers W. The delivery arm A1 is configured to take out a wafer W from the carrier 11, deliver the wafer W to the processing block 5, receive the wafer W from the processing block 5 and return the wafer W back into the carrier 11.

The processing block 5 includes multiple processing modules 14, 15, 16 and 17. As shown in FIG. 2 and FIG. 3, each of the processing modules 14, 15, 16 and 17 incorporates multiple liquid processing units U1, multiple heat treatment units U2 and a transfer arm A3 configured to transfer the wafer W into these units. The processing module 17 further includes a direct transfer arm A6 configured to directly transfer a wafer W without accessing the liquid processing units U1 and the heat treatment units U2. Each liquid processing unit U1 is configured to supply a processing liquid to a surface of a wafer W. Each heat treatment unit U2 incorporates therein, for example, a heating plate and a cooling plate, and is configured to perform a heat treatment by heating the wafer W with the heating plate and cooling the heated wafer W with the cooling plate.

The processing module 14 is configured to form a bottom film on the surface of the wafer W by the liquid processing unit U1 and the heat treatment unit U2. The liquid processing unit U1 of the processing module 14 is configured to coat a processing liquid for forming the bottom film on the wafer W. The heat treatment unit U2 of the processing module 14 is configured to perform various kinds of heat treatments required to form the bottom film.

The processing module 15 is configured to form a resist film on the bottom film by the liquid processing unit U1 and the heat treatment unit U2. The liquid processing unit U1 of the processing module 15 is configured to coat a processing liquid for forming the resist film on the bottom film. The heat treatment unit U2 of the processing module 15 is configured to perform various kinds of heat treatments required to form the resist film.

The processing module 16 is configured to form a top film on the resist film by the liquid processing unit U1 and the heat treatment unit U2. The liquid processing unit U1 of the processing module 16 is configured to coat a liquid for forming the top film on the resist film. The heat treatment unit U2 of the processing module 16 is configured to perform various kinds of heat treatments required to form the top film.

The processing module 17 is configured to perform a developing processing of the exposed resist film, on which the exposure processing is already performed, by the liquid processing unit U1 and the heat treatment unit U2. The liquid processing unit U1 of the processing module 17 is configured to perform the developing processing of the resist film by coating a developing liquid on the surface of the exposed wafer W and washing it with a rinse liquid. The heat treatment unit U2 of the processing module 17 is configured to perform various kinds of heat treatments required for the developing processing. Specific examples of these heat treatments include a heat treatment (PEB: Post Exposure Bake) performed before the developing processing, a heat treatment (PB: Post Bake) performed after the developing processing, and so forth.

Within the processing block 5, a shelf unit U10 is provided at a side of the carrier block 4. The shelf unit U10 is partitioned into a multiple number of cells arranged in a vertical direction. An elevation arm A7 is provided in the vicinity of the shelf unit U10. The elevation arm A7 is configured to move up and down the wafer W among the cells of the shelf unit U10.

Within the processing block 5, a shelf unit U11 is provided at a side of the interface block 6. The shelf unit U11 is partitioned into multiple cells which are arranged in the vertical direction.

The interface block 6 is configured to deliver the wafer W into/from the exposure apparatus 3. By way of example, the interface block 6 incorporates a delivery arm A8 and is connected to the exposure apparatus 3. The delivery arm A8 is configured to deliver the wafer W placed in the shelf unit U11 to the exposure apparatus 3, and receives the wafer W from the exposure apparatus 3 to return the received wafer W back into the shelf unit U11.

The controller 100 controls the coating and developing apparatus 2 to perform a coating and developing processing according to the following sequence, for example. First, the controller 100 controls the delivery arm A1 to transfer the wafer W within the carrier 11 to the shelf unit U10, and controls the elevation arm A7 to place this wafer W in the cell for the processing module 14.

Then, the controller 100 controls the transfer arm A3 to transfer the wafer W placed in the shelf unit U10 into the liquid processing unit U1 and the heat treatment unit U2 within the processing module 14, and controls the liquid processing unit U1 and the heat treatment unit U2 to form the bottom film on the surface of the wafer W. Thereafter, the controller 100 controls the transfer arm A3 to return the wafer W having the bottom film formed thereon back into the shelf unit U10. The controller 100 then controls the elevation arm A7 to place this wafer W in the cell for the processing module 15.

Subsequently, the controller 100 controls the transfer arm A3 to transfer the wafer W placed in the shelf unit U10 into the liquid processing unit U1 and the heat treatment unit U2 within the processing module 15, and controls the liquid processing unit U1 and the heat treatment unit U2 to form the resist film on the bottom film of the wafer W. Thereafter, the controller 100 controls the transfer arm A3 to return the wafer W to the shelf unit U10, and controls the elevation arm A7 to place this wafer W in the cell for the processing module 16.

Afterwards, the controller 100 controls the transfer arm A3 to transfer the wafer W placed in the shelf unit U10 to the respective units within the processing module 16 and controls the liquid processing unit U1 and the heat treatment unit U2 to form the top film on the resist film of the wafer W. Then, the controller 100 controls the transfer arm A3 to return the wafer W to the shelf unit U10, and controls the elevation arm A7 to place this wafer W in the cell for the processing module 17.

Next, the controller 100 controls the direct transfer arm A6 to directly transfer the wafer W placed in the shelf unit U10 to the shelf unit U11, and controls the delivery arm A8 to send this wafer W to the exposure apparatus 3. Thereafter, the controller 100 controls the delivery arm A8 to receive the wafer W on which the exposure processing is already performed from the exposure apparatus 3 and return the received wafer W back into the shelf unit U11.

Thereafter, the controller 100 controls the transfer arm A3 to transfer the wafer W placed in the shelf unit U11 into the respective units within the processing module 17, and controls the liquid processing unit U1 and the heat treatment unit U2 to perform the developing processing on the resist film of the wafer W. Then, the controller 100 controls the transfer arm A3 to return the wafer W to the shelf unit U10, and controls the elevation arm A7 and the delivery arm A1 to return this wafer W back into the carrier 11. Then, the coating and developing processing is ended.

A specific configuration of the substrate processing apparatus is not limited to the above-described configuration of the coating and developing apparatus 2. The substrate processing apparatus may be implemented by any of various types of apparatuses as long as the apparatus has the liquid processing unit U1 for the developing processing (the liquid processing unit U1 of the processing module 17) and the controller 100 capable of controlling this liquid processing unit U1.

[Developing Unit]

Figure 4:
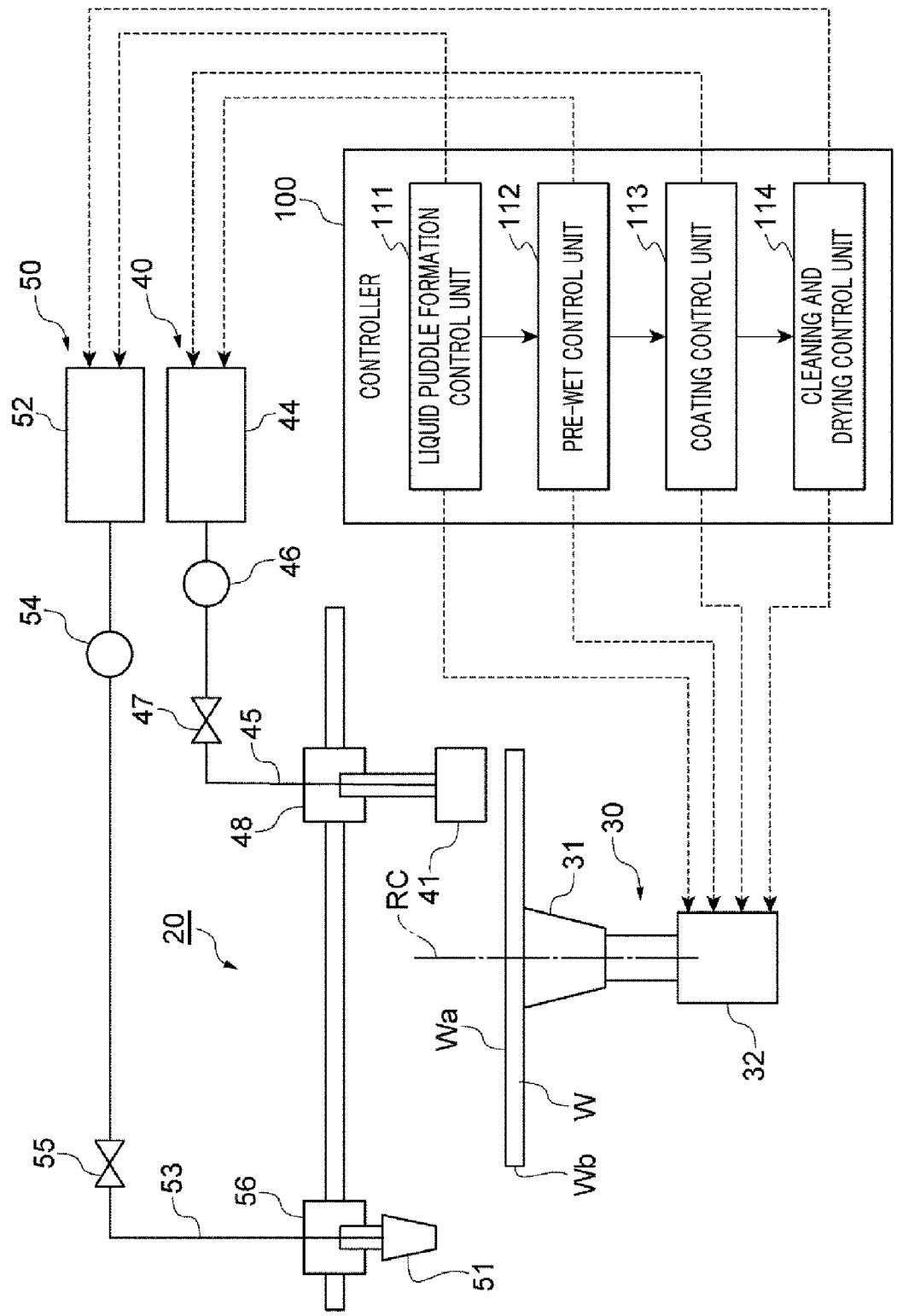
FIG. 4 is a schematic diagram illustrating a configuration of a developing unit.

Now, the liquid processing unit U1 of the processing module 17 will be explained in detail. The processing module 17 has a developing unit 20 as the liquid processing unit U1. As depicted in FIG. 4, the developing unit 20 includes a rotating/holding unit 30, a developing liquid supply unit 40 (second supply unit) and a rinse liquid supply unit 50 (first supply unit).

The rotating/holding unit 30 is configured to hold and rotate the substrate. By way of example, the rotating/holding unit 30 includes a holding device 31 and a rotating device 32. The holding device 31 is configured to support a central portion of the wafer W horizontally placed thereon and holds the wafer W by, for example, vacuum attraction. The rotating device 32 incorporates, for example, an electric motor as a power source and is configured to rotate the holding device 31 around a vertical rotation center (RC). Accordingly, the wafer W is rotated around the rotation center RC.

The developing liquid supply unit 40 is configured to supply a developing liquid (processing liquid) onto a surface Wa of the wafer W. The developing liquid is a processing liquid for removing a removing target portion of the resist film on which the exposure processing is already performed. The removing target portion of the resist film is a portion which is soluble in the developing liquid after the exposure processing. If the developing liquid is of a positive type, a portion exposed in the exposure processing is soluble in the developing liquid. If the developing liquid is of a negative type, on the other hand, a portion which is not exposed in the exposure processing is soluble in the developing liquid. A specific example of the positive type developing liquid may be an alkaline solution. A specific example of the negative type developing liquid may be an organic solvent.

The developing liquid supply unit 40 is equipped with, for example, a nozzle 41, a tank 44, a pump 46, a valve 47 and a nozzle transfer device 48 (position adjusting unit).

Figure 5:
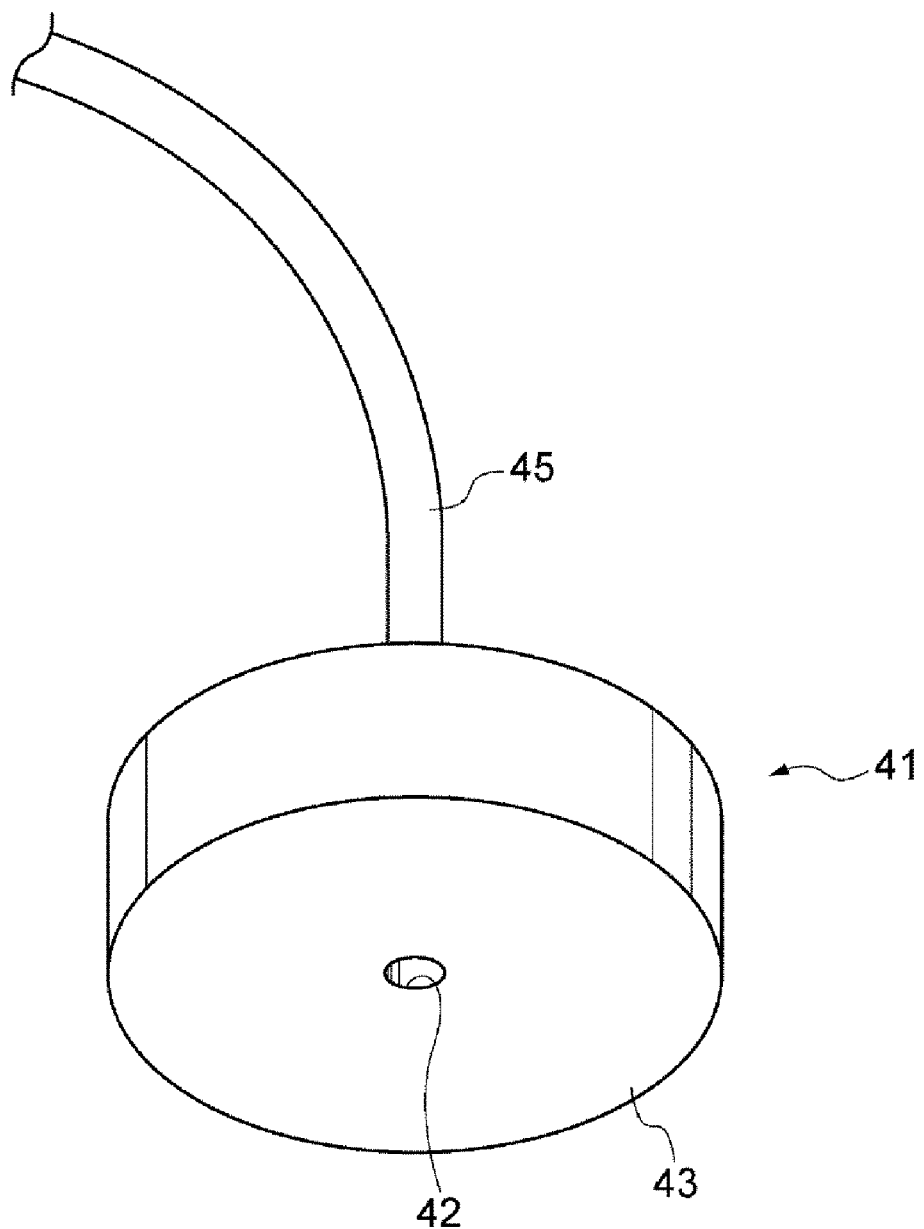
FIG. 5 is a perspective view illustrating an example of a nozzle.

The nozzle 41 is configured to discharge the developing liquid toward the surface Wa of the wafer W. As illustrated in FIG. 5, the nozzle 41 includes a liquid contact surface 43 facing the surface Wa of the wafer W; and a discharge hole 42 which is opened at the liquid contact surface 43 and through which the developing liquid is discharged. By way of example, the nozzle 41 has the liquid contact surface 43 of a circular shape, and the discharge hole 42 is opened at a central portion of the liquid contact surface 43. An area of the liquid contract surface 43 is smaller than an area of the surface Wa of the wafer W. The area of the liquid contact surface 43 may be in a range from 1% to 11%, e.g., 1% to 3%, of the area of the surface Wa of the wafer W. The nozzle 41 may be made of, by way of example, a resin material such as PTFE. Alternatively, the nozzle 41 may have a multiple number of discharge holes 42 with which the liquid contact surface 43 is dotted.

The nozzle 41 may be configured such that an average flow velocity of the developing liquid passing through the liquid contact surface 43 ranges from 1.2 m/min to 5.5 m/min under the condition that a discharge amount of the developing liquid is set to be 90 ml/min. As an example, the average flow velocity may be set to be in a range from 1.2 m/min to 3.5 m/min.

By way of example, the nozzle 41 may be configured such that an opening area of the discharge hole 42 at the liquid contact surface 43 (if the nozzle 41 includes the multiple number of discharge holes 42, a sum of the opening areas of all the discharge holes 42) is in a range from 16.4 $mm^2$ to 75 $mm^2$, more specifically, in a range from 25 $mm^2$ to 75 $mm^2$.

Figure 6:
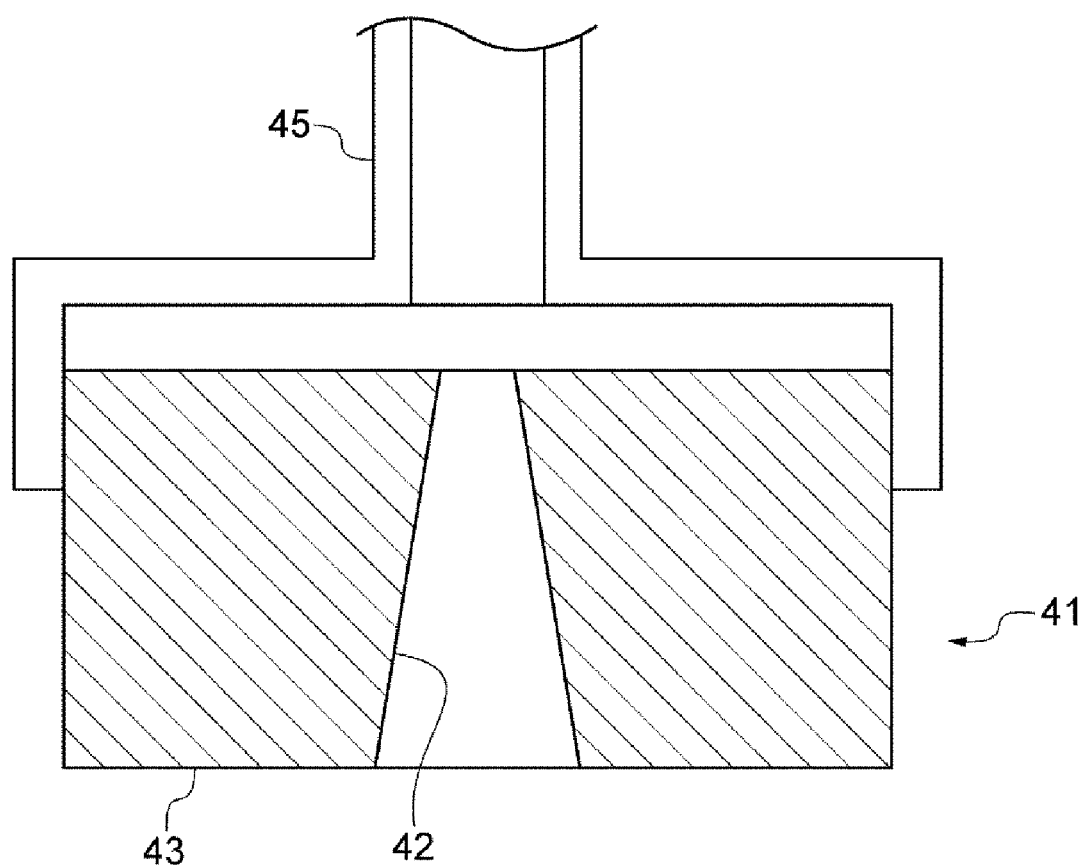
FIG. 6 is a cross sectional view illustrating a modification example of the nozzle.

As shown in FIG. 6, the opening area of the discharge hole 42 may be increased as it approaches the liquid contact surface 43.

Figure 7:
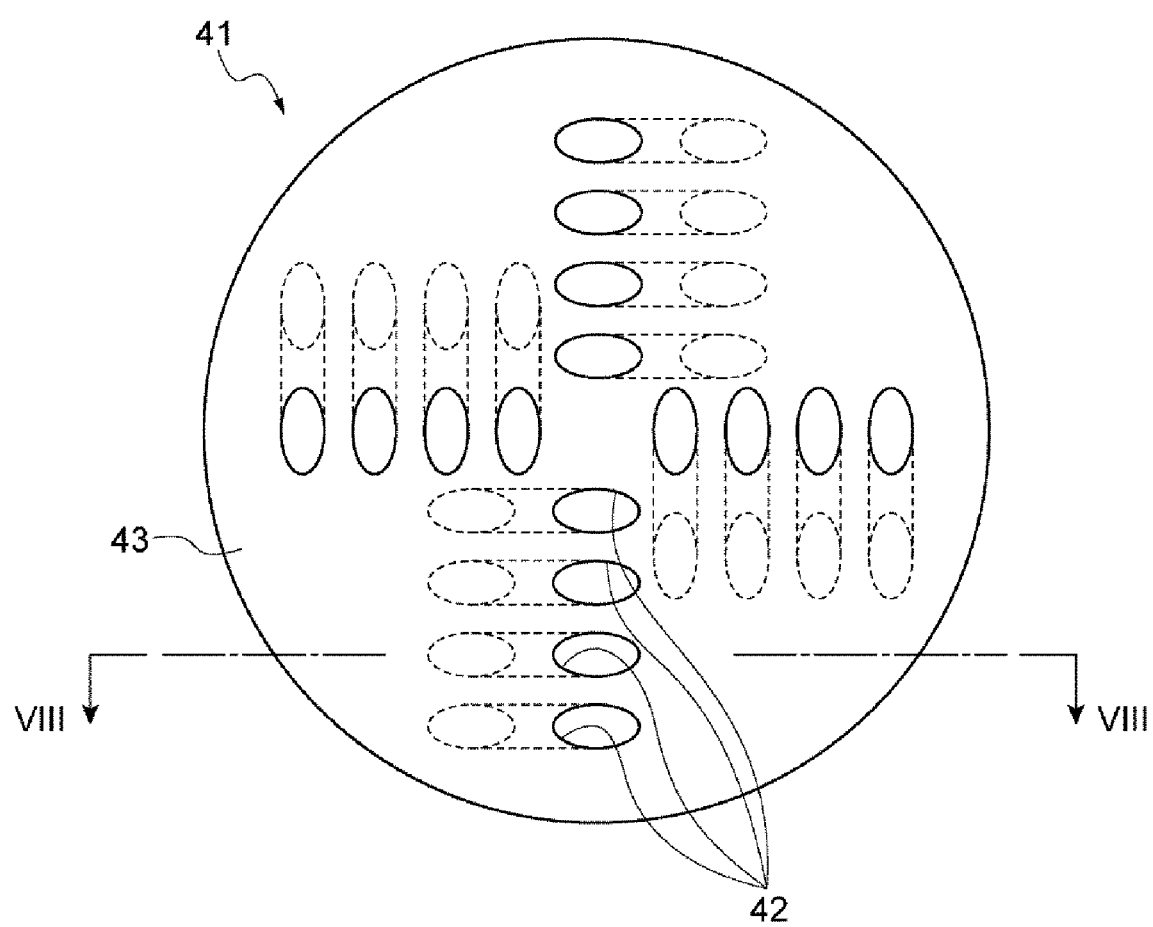
FIG. 7 is a plan view illustrating another modification example of the nozzle.
Figure 8:
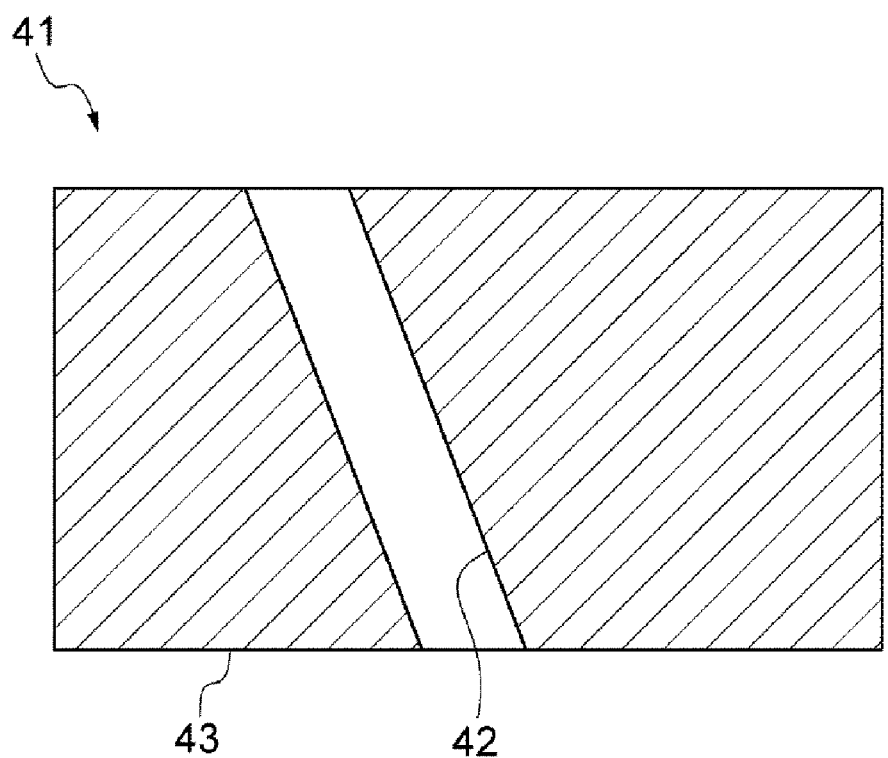
FIG. 8 is a cross sectional view taken along a line VIII-VIII of FIG. 7.

As depicted in FIG. 7 and FIG. 8, the nozzle 41 may be provided with multiple discharge holes 42 arranged in a circumferential direction around a center of the liquid contact surface 43 and inclined in the same direction with respect to the circumferential direction. To be more specific, the nozzle 41 of FIG. 7 and FIG. 8 includes a first group of discharge holes 42 arranged in the circumferential direction; a second group of discharge holes 42 arranged in the circumferential direction at an outer side than the discharge holes 42 of the first group in the nozzle 41; a third group of discharge holes 42 arranged in the circumferential direction at an outer side than the discharge holes 42 of the second group in the nozzle 41; and a fourth group of discharge holes 42 arranged in the circumferential direction at an outer side than the discharge holes 42 of the third group in the nozzle 41. Positions of the discharge holes 42 in the circumferential direction are aligned between the groups. All the discharge holes 42 are inclined in the same direction with respect to the circumferential direction. With the nozzle 41 having this configuration, a rotational flow of the developing liquid is formed between the liquid contact surface 43 and the wafer W, so that uniformity of the developing liquid between the liquid contact surface 43 and the wafer W can be improved.

Referring back to FIG. 4, the nozzle 41 is connected to the tank 44 via a pipeline 45. The tank 44 stores therein the developing liquid. The pump 46 and the valve 47 are provided at the pipeline 45. The pump 46 may be, for example, a bellows pump and is configured to force-feed the developing liquid from the tank 44 to the nozzle 41. The valve 47 may be, by way of example, but not limitation, an air operation valve and is configured to adjust an opening degree of the inside of the pipeline 45. By controlling the valve 47, it is possible to perform a switchover between a state in which the developing liquid is discharged from the nozzle 41 and a state in which the developing liquid is not discharged from the nozzle 41. Further, by controlling at least one of the pump 46 and the valve 47, it is also possible to adjust the discharge amount (discharge amount per unit time) of the developing liquid from the nozzle 41.

The nozzle transfer device 48 is configured to adjust the position of the nozzle 41. To elaborate, the nozzle transfer device 48 transfers the nozzle 41 such that the nozzle 41 crosses over the wafer W with the liquid contact surface 43 facing downwards, and also moves the nozzle 41 up and down. For example, the nozzle transfer device 48 is equipped with a device configured to transfer the nozzle 41 such that the nozzle 41 crosses over the wafer W by using an electric motor or the like as a power source; and a device configured to move the nozzle 41 up and down by using an electric motor or the like as a power source.

The nozzle transfer device 48 may transfer the nozzle 41 along a path passing through the rotation center RC of the wafer W or may transfer the nozzle 41 along a path deviated from the rotation center RC. The nozzle transfer device 48 may transfer the nozzle 41 along a straight line-shaped path or a curved path.

The rinse liquid supply unit 50 is configured to supply a rinse liquid (diluting liquid) onto the surface Wa of the wafer W. The rinse liquid may be, by way of example, pure water.

The rinse liquid supply unit 50 includes, for example, a nozzle 51, a tank 52, a pump 54, a valve 55 and a nozzle transfer device 56 (position adjusting unit).

The nozzle 51 is configured to discharge the rinse liquid toward the surface Wa of the wafer W. The nozzle 51 is connected to the tank 52 via a pipeline 53. The tank 52 accommodates therein the rinse liquid. The pump 54 and the valve 55 are provided at the pipeline 53. The pump 54 may be, for example, a bellows pump and is configured to force-feed the rinse liquid from the tank 52 to the nozzle 51. The valve 55 may be, by way of example, but not limitation, an air operation valve and is configured to adjust an opening degree of the inside of the pipeline 53. By controlling the valve 55, it is possible to perform a switchover between a state in which the rinse liquid is discharged from the nozzle 51 and a state in which the rinse liquid is not discharged from the nozzle 51. Further, by controlling at least one of the pump 54 and the valve 55, it is also possible to adjust a discharge amount of the rinse liquid from the nozzle 51.

The nozzle transfer device 56 is configured to transfer the nozzle 51 by using an electric motor or the like as a power source. To be specific, the nozzle transfer device 56 transfers the nozzle 51 such that the nozzle 51 crosses over the wafer W with a discharge hole thereof facing downwards.

The developing unit 20 having the above-described configuration is controlled by the aforementioned controller 100. The controller 100 is configured to control the rinse liquid supply unit 50 to supply the rinse liquid onto the surface Wa and form a liquid puddle of the rinse liquid. The controller 100 is also configured to control the developing liquid supply unit 40 to bring the liquid contact surface 43 into contact with the liquid puddle of the rinse liquid by moving the nozzle 41 through the nozzle transfer device 48 and to form a liquid puddle of a diluted developing liquid by discharging the developing liquid from the discharge hole 42. Further, the controller 100 is also configured to control the rotating/holding unit 30 to rotate the wafer W at a first rotation speed which allows the diluted developing liquid located at an inner side than an edge of the liquid contact surface 43 to stay between the liquid contact surface 43 and the surface Wa and allows the diluted developing liquid located at an outer side than the edge of the liquid contact surface 43 to be diffused toward an edge of the wafer W. Furthermore, the controller 100 is also configured to control the rotating/holding unit 30 to rotate the wafer W at a second rotation speed lower than the first rotation speed after the wafer W is rotated at the first rotation speed. The controller 100 is also configured to control the developing liquid supply unit 40 to move the nozzle 41 toward the edge of the wafer W by the nozzle transfer device 48 while rotating the wafer W at the second rotation speed and discharging the developing liquid from the discharge hole 42.

By way of non-limiting example, the controller 100 includes, as functional components (hereinafter, referred to as "functional blocks"), a liquid puddle formation control unit 111, a pre-wet control unit 112, a coating control unit 113 and a cleaning and drying control unit 114.

The liquid puddle formation control unit 111 is configured to perform a control for forming the liquid puddle of the rinse liquid on the surface Wa of the wafer W. This control includes controlling the rinse liquid supply unit 50 to supply the rinse liquid onto the surface Wa and form the liquid puddle of the rinse liquid thereon.

The pre-wet control unit 112 is configured to perform a control for coating a mixed solution (hereinafter, referred to as "diluted developing liquid") of the rinse liquid and the developing liquid on the surface Wa of the wafer W. This control includes controlling the developing liquid supply unit 40 to bring the liquid contact surface 43 into contact with the liquid puddle of the rinse liquid by moving the nozzle 41 through the nozzle transfer device 48 and to form the liquid puddle of the diluted developing liquid by discharging the developing liquid from the discharge hole 42; and controlling the rotating/holding unit 30 to rotate the wafer W at the first rotation speed which allows the diluted developing liquid located at the inner side than the edge of the liquid contact surface 43 to stay between the liquid contact surface 43 and the surface Wa and allows the diluted developing liquid located at the outer side than the edge of the liquid contact surface 43 to be diffused toward the edge of the wafer W.

The coating control unit 113 is configured to perform a control for coating the developing liquid on the surface Wa of the wafer W. This control includes controlling the rotating/holding unit 30 to rotate the wafer W at the second rotation speed lower than the first rotation speed after the wafer W is rotated at the first rotation speed; and controlling the developing liquid supply unit 40 to move the discharge hole 42 toward an edge Wb of the wafer W by the nozzle transfer device 48 while rotating the wafer W at the second rotation speed and discharging the developing liquid from the discharge hole 42.

The cleaning and drying control unit 114 is configured to perform a control for cleaning and drying the surface Wa of the wafer W after the developing processing. This control includes controlling the rotating/holding unit 30 to rotate the wafer W at a fourth rotation speed higher than the second rotation speed; controlling the rinse liquid supply unit 50 to supply the rinse liquid onto the surface Wa of the wafer W while the wafer W is being rotated at the fourth rotation speed; and controlling the rotating/holding unit 30 to rotate the wafer W at a fifth rotation speed higher than the fourth rotation speed after the supply of the rinse liquid is completed.

Figure 9:
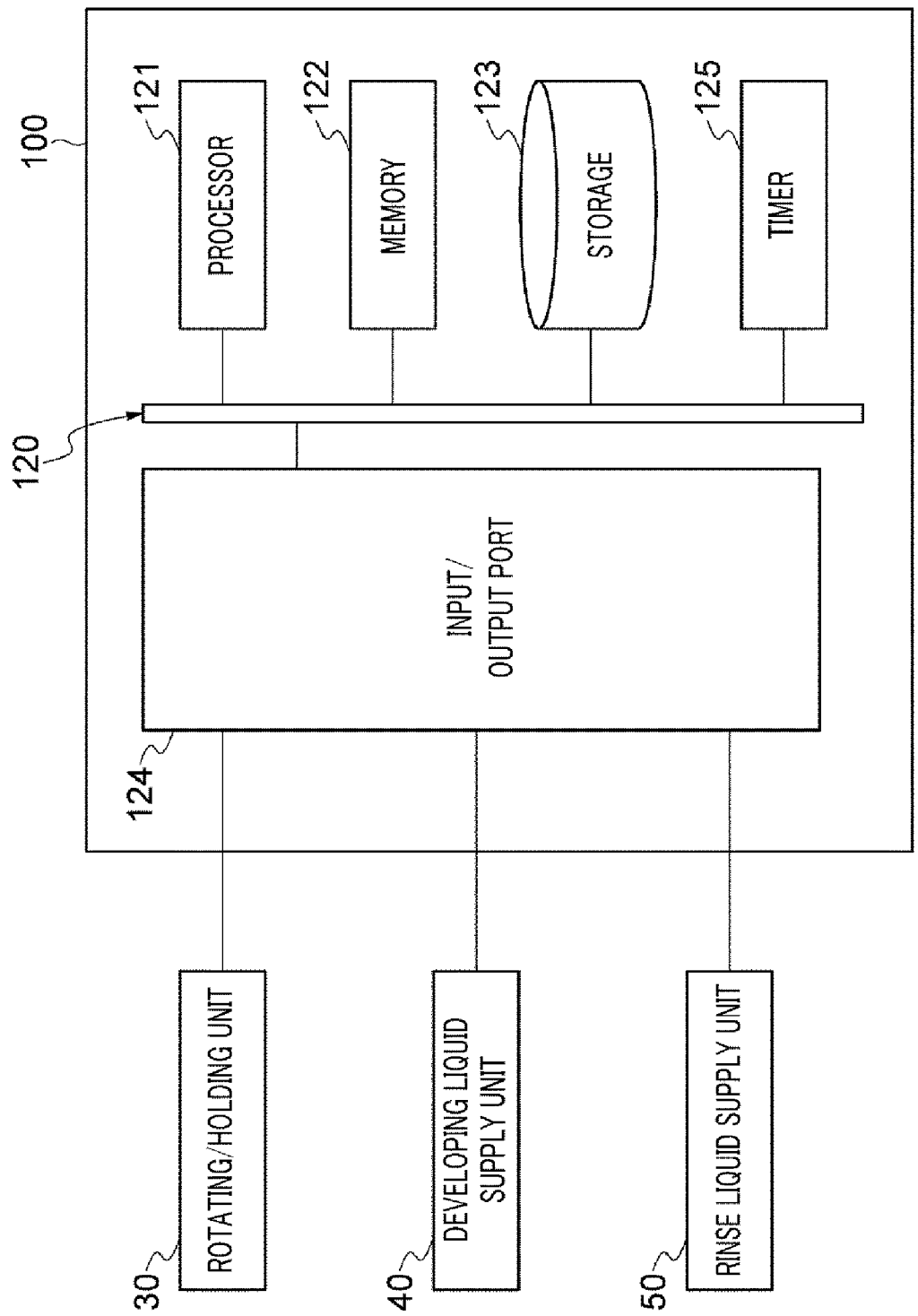
FIG. 9 is a schematic diagram illustrating an example of a hardware configuration of a control unit.

The controller 100 is composed of one or more control computers. By way of example, the controller 100 has a circuit 120 shown in FIG. 9. The circuit 120 includes one or more processors 121, a memory 122, a storage 123, an input/output port 124 and a timer 125. The input/output port 124 is configured to perform an input and an output of electric signals among the rotating/holding unit 30, the developing liquid supply unit 40, the rinse liquid supply unit 50, and so forth. The timer 125 is configured to measure an elapsed time by, for example, counting a reference pulse of a preset cycle.

The storage 123 has a computer readable recording medium such as, but not limited to, a hard disk. The recording medium stores a program that causes the processing block 5 to perform a substrate processing sequence to be described later. The recording medium may be implemented by a portable medium such as a non-volatile semiconductor memory, a magnetic disk or an optical disk. The memory 122 temporarily stores thereon a program loaded from the recording medium of the storage 123 and an operation result by the processor 121. The processor 121 constitutes the aforementioned individual functional modules by executing the program in cooperation with the memory 122.

Further, a hardware configuration of the controller 100 is not limited to constituting the individual functional modules by the program. For example, each functional module of the controller 100 may be implemented by a dedicated logical circuit or an ASIC (Application Specific Integrated Circuit) which is an integration of the logical circuits.

[Developing Processing Sequence]

Figure 10:
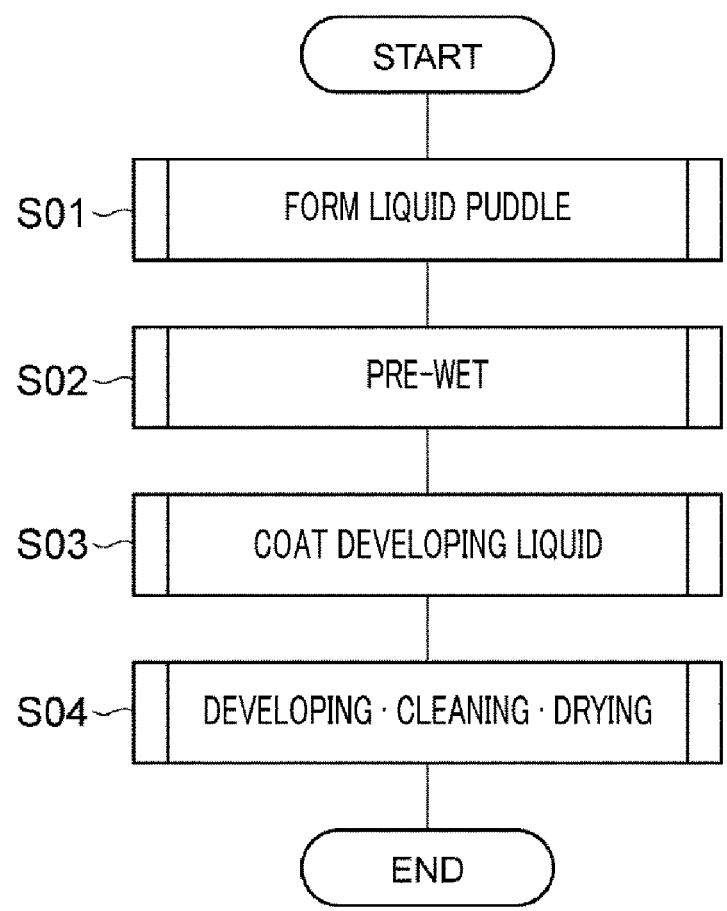
FIG. 10 is a flowchart for describing a developing processing sequence.

Now, a sequence of the developing processing performed by the developing unit 20 under the control of the controller 100 will be explained as an example of a substrate processing method. As depicted in FIG. 10, the controller 100 performs processes S01, S02, S03 and S04 in sequence. In the process S01, the liquid puddle formation control unit 111 performs the control for forming the liquid puddle of the rinse liquid on the surface Wa of the wafer W. In the process S02, the pre-wet control unit 112 performs the control for coating the diluted developing liquid on the surface Wa of the wafer W. In the process S03, the coating control unit 113 performs the control for coating the developing liquid on the surface Wa of the wafer W. In the process S04, the cleaning and drying control unit 114 performs the control for cleaning and drying the surface Wa of the wafer W after the developing processing. In the following, details of each process will be described.

<Liquid Puddle Formation Sequence>

In the aforementioned process S01, the liquid puddle formation control unit 111 controls the rinse liquid supply unit 50 to supply the rinse liquid onto the surface Wa of the wafer W and form the liquid puddle of the rinse liquid on a region of the wafer W including the rotation center RC thereof.

Figure 11:
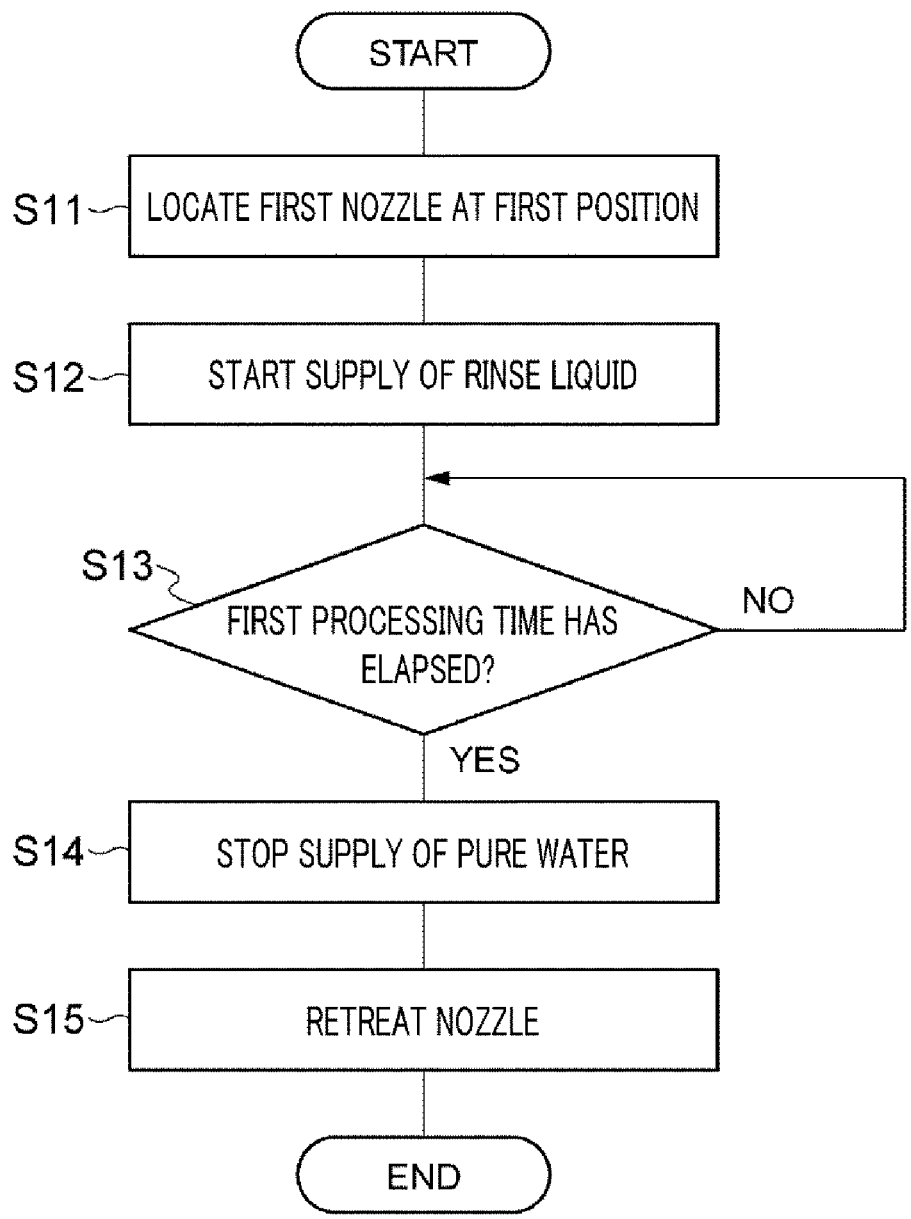
FIG. 11 is a flowchart for describing a sequence of forming a liquid puddle of a rinse liquid.

As illustrated in FIG. 11, the liquid puddle formation control unit 111 performs processes S11, S12, S13, S14 and S15 in sequence.

In the process S11, the liquid puddle formation control unit 111 controls the rinse liquid supply unit 50 to move the nozzle 51 to be located at a first position by the nozzle transfer device 56. The first position is, for example, a position above the rotation center RC of the wafer W.

Figure 12A:
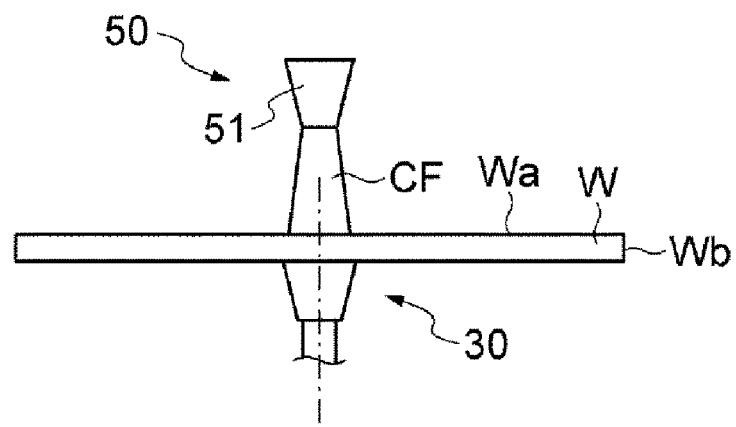
FIG. 12A and FIG. 12B are schematic diagrams illustrating states of a substrate while forming the liquid puddle of the rinse liquid.

In the process S12, the liquid puddle formation control unit 111 controls the rinse liquid supply unit 50 to start a supply of a rinse liquid CF (see FIG. 12A). For example, the liquid puddle formation control unit 111 controls the rinse liquid supply unit 50 to start a supply of the rinse liquid CF from the tank 52 to the nozzle 51 by opening the valve 55 and start a discharge of the rinse liquid CF from the nozzle 51 to the surface Wa.

In the process S13, the liquid puddle formation control unit 111 awaits a lapse of a first processing time. The first processing time is previously set in a condition setting or the like to form a liquid puddle having a required size on the surface Wa.

In the process S14, the liquid puddle formation control unit 111 controls the rinse liquid supply unit 50 to stop the supply of the rinse liquid. By way of example, the liquid puddle formation control unit 111 controls the rinse liquid supply unit 50 to stop the supply of the rinse liquid from the tank 52 to the nozzle 51 by closing the valve 55.

Figure 12B:
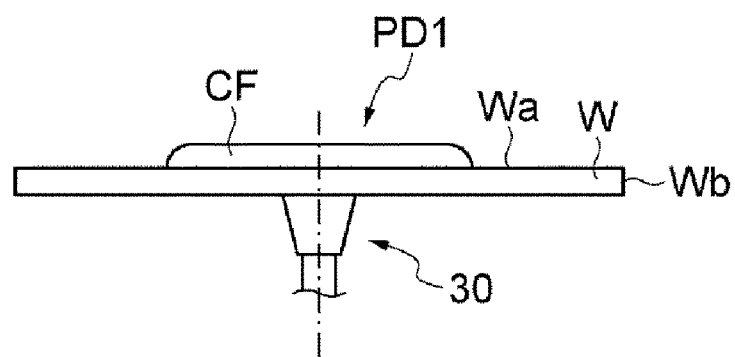

In the process S15, the liquid puddle formation control unit 111 controls the rinse liquid supply unit 50 to retreat the nozzle 51 from above the wafer W by moving the nozzle 51 through the nozzle transfer device 56. Through the above-described processes, a liquid puddle PD1 of the rinse liquid CF is formed on the region including the rotation center RC (see FIG. 12B).

Further, the liquid puddle formation control unit 111 may control the rinse liquid supply unit 50 to supply the rinse liquid CF onto the surface Wa of the wafer W while rotating the wafer W at a low speed which does not accompany a diffusion of the rinse liquid CF.

<Pre-Wet Sequence>

In the process S02, the pre-wet control unit 112 controls the developing liquid supply unit 40 to bring the liquid contact surface 43 into contact with the liquid puddle of the rinse liquid by moving the nozzle 41 through the nozzle transfer device 48 and to form the liquid puddle of the diluted developing liquid by discharging the developing liquid from the discharge hole 42. Further, in the process S02, the pre-wet control unit 112 also controls the rotating/holding unit 30 to rotate the wafer W at a first rotation speed which allows the diluted developing liquid located at the inner side than the edge of the liquid contact surface 43 to stay between the liquid contact surface 43 and the surface Wa and allows the diluted developing liquid located at the outer side than the edge of the liquid contact surface 43 to be diffused toward the edge of the wafer W.

The controlling of the developing liquid supply unit 40 such that the liquid contact surface 43 is brought into contact with the liquid puddle of the rinse liquid by moving the nozzle 41 through the nozzle transfer device 48 may include controlling the developing liquid supply unit 40 to move the nozzle 41 close to the surface Wa by the nozzle transfer device 48 in a state that the discharge hole 42 is filled with the developing liquid.

The controlling of the developing liquid supply unit 40 such that the nozzle 41 is moved close to the surface Wa in the state that the discharge hole 42 is filled with the developing liquid may include controlling the developing liquid supply unit 40 to move the nozzle 41 close to the surface Wa by the nozzle transfer device 48 while discharging the developing liquid from the discharge hole 42.

The pre-wet control unit 112 may further control the rotating/holding unit 30 to rotate the wafer W at a third rotation speed lower than the first rotation speed when the developing liquid supply unit 40 brings the liquid contact surface 43 into contact with the liquid puddle of the rinse liquid by moving the nozzle 41 through the nozzle transfer device 48 and discharges the developing liquid from the discharge hole 42.

The controlling of the developing liquid supply unit 40 such that the liquid contact surface 43 is brought into contact with the liquid puddle of the rinse liquid by moving the nozzle 41 through the nozzle transfer device 48 may include controlling the developing liquid supply unit 40 to bring the liquid contact surface 43 into contact with the liquid puddle of the rinse liquid at a position where the center of the liquid contact surface 43 is deviated from the rotation center RC. Further, the controlling of the developing liquid supply unit 40 such that the liquid puddle of the diluted developing liquid is formed by discharging the developing liquid from the discharge hole 42 may include controlling the developing liquid supply unit 40 such that the center of the liquid contact surface 43 is moved close to the rotation center RC by moving the nozzle 41 by the nozzle transfer device 48 while discharging the developing liquid from the discharge hole 42.

As depicted in FIG. 13, the pre-wet control unit 112 performs processes S21, S22, S23, S24, S25, S26, S27 and S28 in order.

In the process S21, the pre-wet control unit 112 controls the rotating/holding unit 30 such that the wafer W is begun to be rotated at a rotation speed ω1 (third rotation speed).

The rotation speed $\omega 1$ may be, by way of non-limiting example, equal to or less than 100 rpm or equal to or less than 50 rpm.

In the process S22, the pre-wet control unit 112 controls the developing liquid supply unit 40 to move the nozzle 41 by the nozzle transfer device 48 and locate the nozzle 41 at a second position. The second position is a position above a position deviated from the rotation center RC of the wafer W within a region where the liquid puddle PD1 of the rinse liquid is formed (see FIG. 14A). The second position may be set such that a distance D1 between the center of the liquid contact surface 43 and the rotation center RC is in a range from 10 mm to 50 mm and such that a distance D2 between the liquid contact surface 43 and the surface Wa is in a range from 5 mm to 12 mm.

In the process S23, the pre-wet control unit 112 controls the developing liquid supply unit 40 to start a discharge of a developing liquid DF from the discharge hole 42 (see FIG. 14B). For example, the pre-wet control unit 112 controls the developing liquid supply unit 40 to start a supply of the developing liquid DF to the nozzle 41 from the tank 44 by opening the valve 47. Accordingly, the inside of the discharge hole 42 is filled with the developing liquid DF.

In the process S24, the pre-wet control unit 112 controls the developing liquid supply unit 40 such that the liquid contact surface 43 is brought into contact with the liquid puddle PD1 of the rinse liquid CF1 by moving the nozzle 41 close to the surface Wa through the nozzle transfer device 48. For example, the pre-wet control unit 112 controls the developing liquid supply unit 40 to lower the nozzle 41 to a third position by the nozzle transfer device 48. The third position is set to allow the liquid contact surface 43 to be in contact with the liquid puddle PD1. The third position may be set such that a distance D3 between the liquid contact surface 43 and the surface Wa is in a range from 0.3 mm to 2.5 mm. As the nozzle 41 is placed close to the surface Wa, the developing liquid DF discharged from the discharge hole 42 is mixed into the liquid puddle PD1.

In the process S25, the pre-wet control unit 112 controls the developing liquid supply unit 40 such that the center of the liquid contact surface 43 comes close to the rotation center RC by moving the nozzle 41 through the nozzle transfer device 48 (see FIG. 14C). Since a relative position between the discharge hole 42 and the liquid puddle PD1 is changed as the wafer W is rotated and the nozzle 41 is moved, the developing liquid DF discharged from the discharge hole 42 is mixed into the liquid puddle PD1 while being dispersed extensively. Accordingly, uniformity of a concentration of the diluted developing liquid can be increased. If the center of the liquid contact surface 43 reaches the rotation center RC, the pre-wet control unit 112 controls the developing liquid supply unit 40 to stop the movement of the nozzle 41 by the nozzle transfer device 48.

In the process S26, the pre-wet control unit 112 controls the developing liquid supply unit 40 to stop the discharge of the developing liquid DF from the discharge hole 42. For example, the pre-wet control unit 112 controls the developing liquid supply unit 40 to stop the supply of the developing liquid from the tank 44 to the nozzle 41 by closing the valve 47. By the processes performed so far, a liquid puddle PD2 of a diluted developing liquid MF is formed on the surface Wa of the wafer W (see FIG. 14C).

In the process S27, the pre-wet control unit 112 controls the rotating/holding unit 30 to change the rotation speed of the wafer W from the rotation speed $\omega 1$ to a rotation speed $\omega 2$ (first rotation speed). The rotation speed $\omega 2$ is set such that the diluted developing liquid MF located at the inner side than the edge of the liquid contact surface 43 stays between the liquid contact surface 43 and the surface Wa while the diluted developing liquid MF located at the outer side than the edge of the liquid contact surface 43 is diffused toward the edge Wb (see FIG. 14D). The rotation speed $\omega 2$ is set to be, by way of example, but not limitation, 300 rpm to 1500 rpm, for example, 800 rpm to 1200 rpm.

In the process S28, the pre-wet control unit 112 awaits a lapse of a second processing time. The second processing time is previously set in the condition setting or the like to diffuse the diluted developing solution MF located at the outer side than the edge of the liquid contact surface 43 in a sufficiently wide manner and to stay the diluted developing liquid MF located at the inner side than the edge of the liquid contact surface 43 to stay between the liquid contact surface 43 and the surface Wa.

By the processes performed so far, the diluted developing liquid MF is coated on the surface Wa of the wafer W. Further, the second position may be set to be located above the rotation center RC. In this case, the process S25 can be omitted. After the process S23, the pre-wet control unit 112 may control the developing liquid supply unit 40 to stop the supply of the developing liquid DF from the tank 44 to the nozzle 41 at a time point when the inside of the discharge hole 42 is filled with the developing liquid DF and to resume the supply of the developing liquid DF from the tank 44 to the nozzle 41 after the liquid contact surface 43 comes into contact with the liquid puddle PD1. Furthermore, the pre-wet control unit 112 may perform the process S23 after the liquid contact surface 43 comes into contact with the liquid puddle PD1. The rotation speed $\omega 1$ may be set to be zero.

<Developing Liquid Coating Sequence>

In the process S03, the coating control unit 113 controls the rotating/holding unit 30 to rotate the wafer W at the second rotation speed smaller than the first rotation speed after rotating the wafer W at the first rotation speed, and also controls the developing liquid supply unit 40 to move the nozzle 41 toward the edge Wb of the wafer W by the nozzle transfer device 48 while rotating the wafer W at the second rotation speed and discharging the developing liquid from the discharge hole 42.

The controlling of the developing liquid supply unit 40 such that the nozzle 41 is moved toward the edge Wb of the wafer W by the nozzle transfer device 48 while rotating the wafer W at the second rotation speed and discharging the developing liquid from the discharge hole 42 may include controlling the developing liquid supply unit 40 to increase the discharge amount of the developing liquid from the discharge hole 42 while the nozzle 41 is being moved toward the edge Wb.

Figure 15:
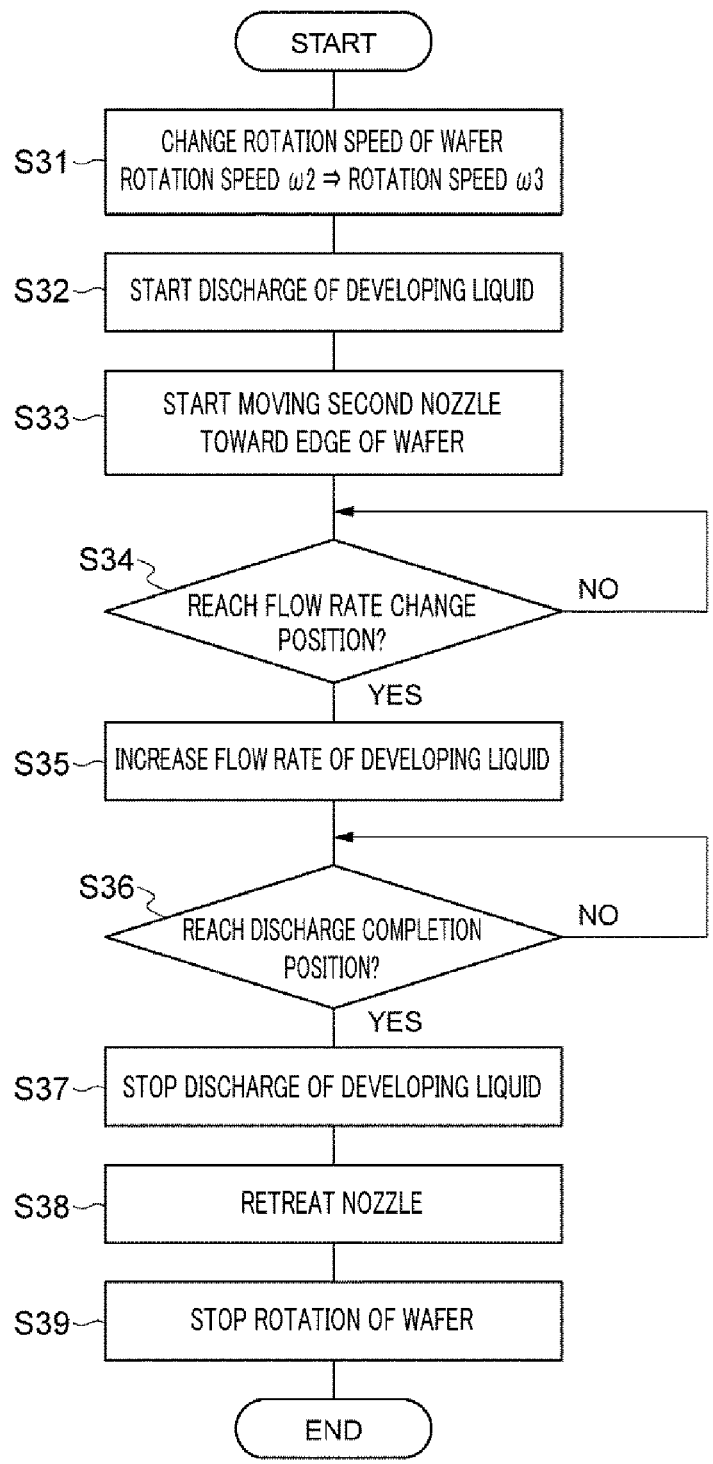
FIG. 15 is a flowchart for describing a sequence of a coating processing.

As illustrated in FIG. 15, the coating control unit 113 performs processes S31, S32, S33, S34, S35, S36, S37, S38 and S39 in order.

In the process S31, the coating control unit 113 controls the rotating/holding unit 30 to change the rotation speed of the wafer W from the rotation speed $\omega 2$ to a rotation speed $\omega 3$ (second rotation speed). The rotation speed $\omega 3$ is smaller than the rotation speed $\omega 2$. The rotation speed $\omega 3$ may be equal to or higher than the rotation speed $\omega 1$. By way of non-limiting example, the rotation speed $\omega 3$ may be in a range from 30 rpm to 100 rpm.

Figure 16B:
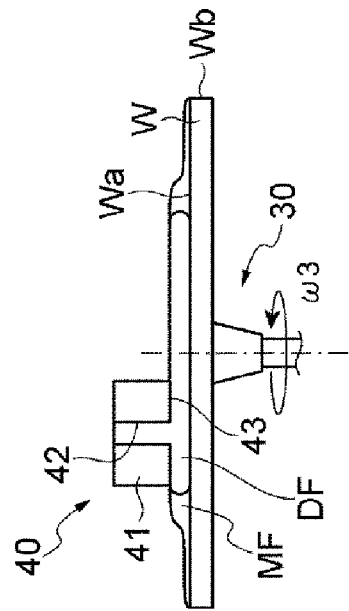
FIG. 16A to FIG. 16D are schematic diagrams illustrating states of the substrate while performing the coating processing of a developing liquid.
Figure 16A:
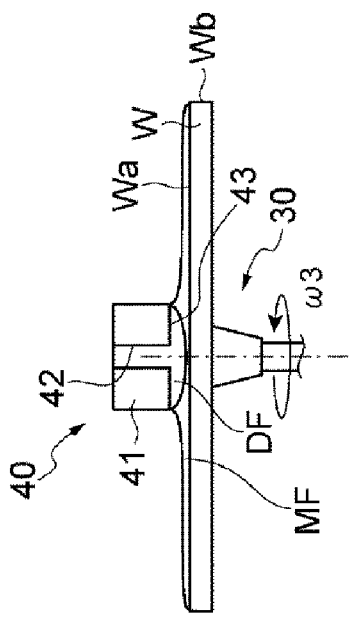

In the process S32, the coating control unit 113 controls the developing liquid supply unit 40 to start a discharge of the developing liquid DF from the discharge hole 42 (see FIG. 16A). For example, the coating control unit 113 controls the developing liquid supply unit 40 to start a supply of the developing liquid DF from the tank 44 to the nozzle 41 by opening the valve 47. The developing liquid DF discharged from the discharge hole 42 is mixed into the diluted developing liquid MF which stays between the liquid contact surface 43 and the surface Wa. Since the diluted developing liquid MF exists between the developing liquid DF and the surface Wa, progression of the developing processing in the vicinity of the rotation center RC is suppressed.

At this time, the coating control unit 113 may control the developing liquid supply unit 40 such that an average flow velocity of the developing liquid DF in the discharge hole 42 is in a range from 1.2 m/min to 5.5 m/min, e.g., 1.2 m/min to 3.5 m/min.

In the process S33, the coating control unit 113 controls the developing liquid supply unit 40 to start moving the nozzle 41 toward the edge Wb by the nozzle transfer device 48 (see FIG. 16B). Thereafter, the coating control unit 113 may control the developing liquid supply unit 40 such that the rotation speed ω3 [rpm] and a moving speed V [mm/s] of the nozzle 41 satisfy the following expression.

$$3 \leq \omega 3/V \leq 5$$

The coating control unit 113 may control the developing liquid supply unit 40 such that the rotation speed ω3 [rpm] and the moving speed V [mm/s] of the nozzle 41 satisfy the following expression.

$$3.5 \leq \omega 3/V \leq 4.5$$

In the process S34, the coating control unit 113 waits for the nozzle 41 to reach a flow rate change position. The flow rate change position is previously set in the condition setting or the like to suppress the progression of the developing processing at a center side of the wafer W more appropriately. The flow rate change position may be a position where the distance between the center of the liquid contact surface 43 and the rotation center RC is in a range from 10 mm to 50 mm, and may be in a range from 20 mm to 40 mm.

In the process S35, the coating control unit 113 controls the developing liquid supply unit 40 to increase the discharge amount of the developing liquid from the discharge hole 42. By way of example, the coating control unit 113 controls the developing liquid supply unit 40 to increase an opening degree of the valve 47. For example, the discharge amount of the developing liquid after the process S35 is set to be in a range from twice to seven times the discharge amount of the developing liquid before the process S35, e.g., 2.5 times to 4 times.

In the process S36, the coating control unit 113 waits for the nozzle 41 to reach a discharge completion position. The discharge completion position is previously set in the condition setting or the like such that the developing liquid DF is sufficiently supplied from the rotation center RC to the edge Wb (see FIG. 16C).

In the process S37, the coating control unit 113 controls the developing liquid supply unit 40 to stop the discharge of the developing liquid from the discharge hole 42. By way of example, the coating control unit 113 controls the developing liquid supply unit 40 to stop the supply of the developing liquid from the tank 44 to the nozzle 41 by closing the valve 47.

In the process S38, the coating control unit 113 controls the developing liquid supply unit 40 to retreat the nozzle 41 from above the wafer W by moving the nozzle 41 through the nozzle transfer device 48.

In the process S39, the coating control unit 113 controls the rotating/holding unit 30 to stop the rotation of the wafer W.

Figure 16D:
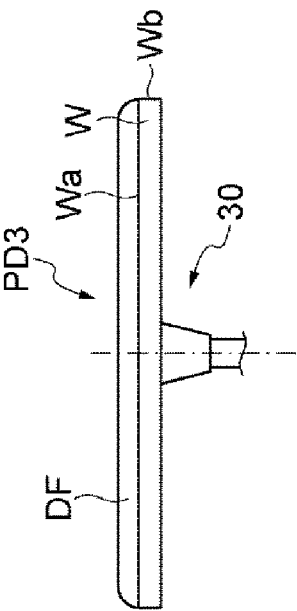
Figure 16C:
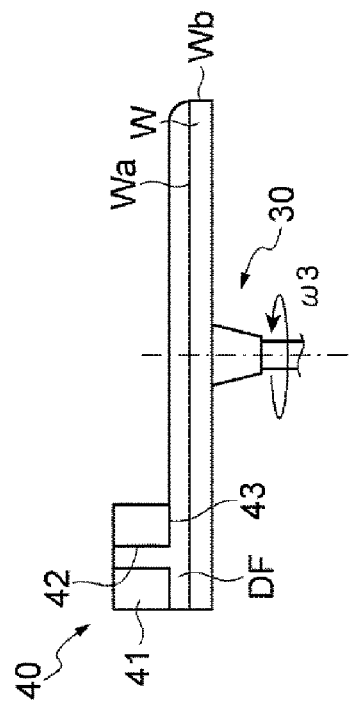

By the processes performed so far, a liquid film PD3 of the developing liquid DF is formed on the surface Wa (see FIG. 16D). The coating control unit 113 may not change the discharge amount of the developing liquid from the discharge hole 42. That is, the processes S34 and S35 may be omitted.

<Developing, Cleaning and Drying Sequence>

In the process S04, after waiting for the developing processing by the liquid film PD3 of the developing liquid DF to progress, the cleaning and drying control unit 114 is configured to perform controlling the rotating/holding unit 30 to rotate the wafer W at a fourth rotation speed higher than the second rotation speed; controlling the rinse liquid supply unit 50 to supply the rinse liquid onto the surface Wa of the wafer W while the wafer W is being rotated at the fourth rotation speed; and, after the supply of the rinse liquid is completed, controlling the rotating/holding unit 30 to rotate the wafer W at a fifth rotation speed higher than the fourth rotation speed.

Figure 17:
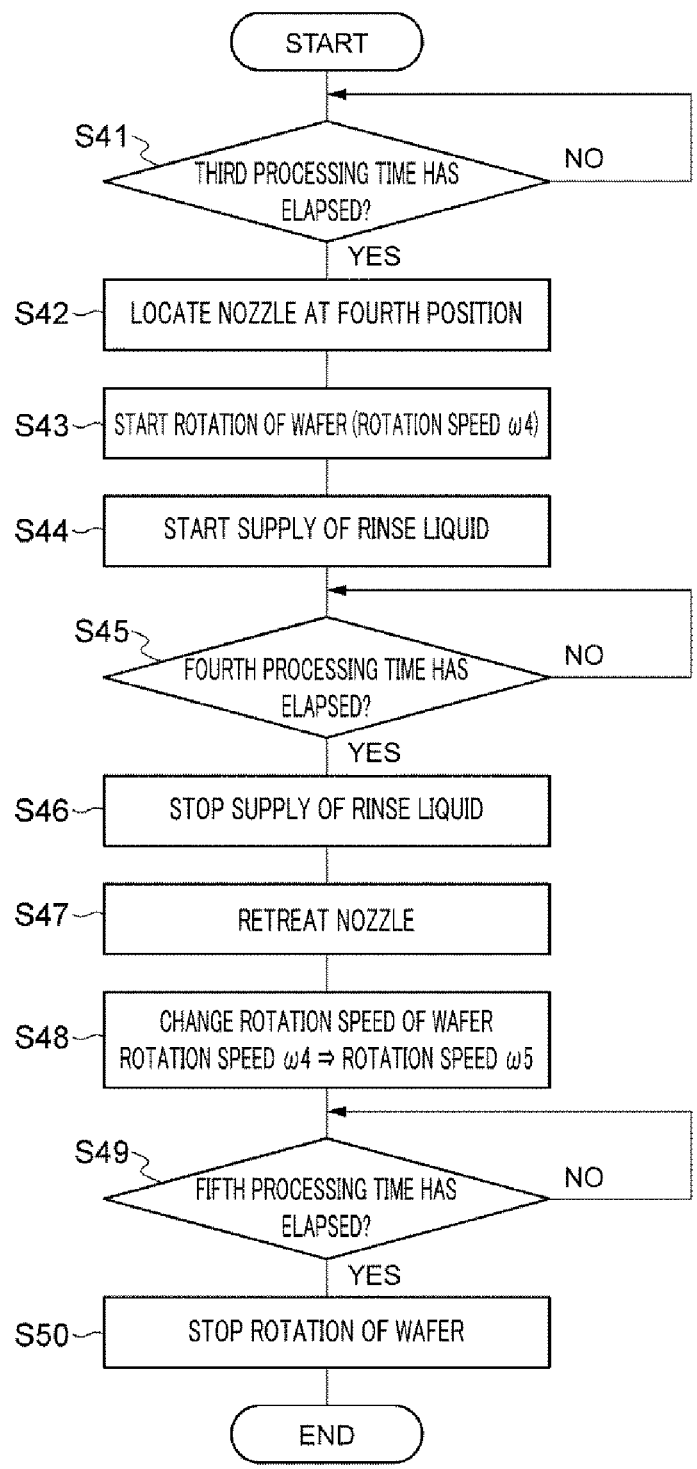
FIG. 17 is a flowchart for describing a sequence of a developing processing, a cleaning processing and a drying processing.

As depicted in FIG. 17, the cleaning and drying control unit 114 performs processes S41, S42, S43, S44, S45, S46, S47, S48, S49 and S50 in order.

In the process S41, the cleaning and drying control unit 114 awaits a lapse of a third processing time. The third processing time is previously set in the condition setting or the like to optimize a degree of the progression of the developing processing.

In the process S42, the cleaning and drying control unit 114 controls the rinse liquid supply unit 50 to locate the nozzle 51 at a fourth position by moving the nozzle 51 through the nozzle transfer device 56. The fourth position may be, for example, a position above the rotation center RC of the wafer W.

In the process S43, the cleaning and drying control unit 114 controls the rotating/holding unit 30 to start a rotation of the wafer W at a rotation speed ω4 (fourth rotation speed). The rotation speed ω4 may be in a range from, but not limited to, 500 rpm to 1500 rpm.

Figure 18A:
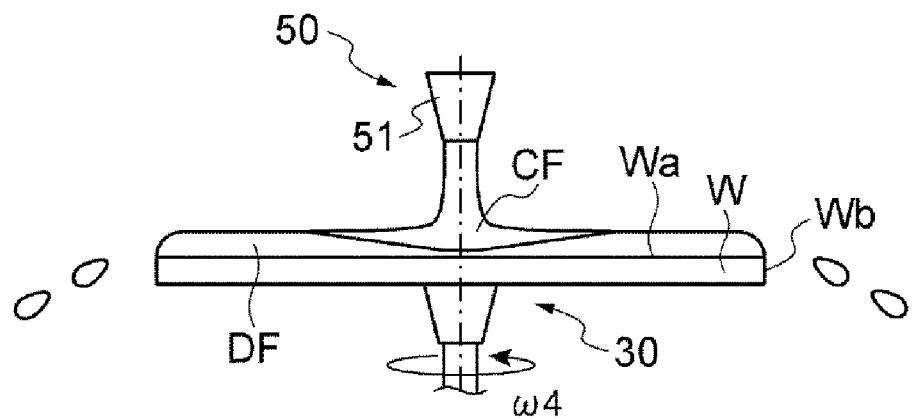
FIG. 18A to FIG. 18C are schematic diagrams illustrating states of the substrate while performing the cleaning processing and the drying processing.
Figure 18B:
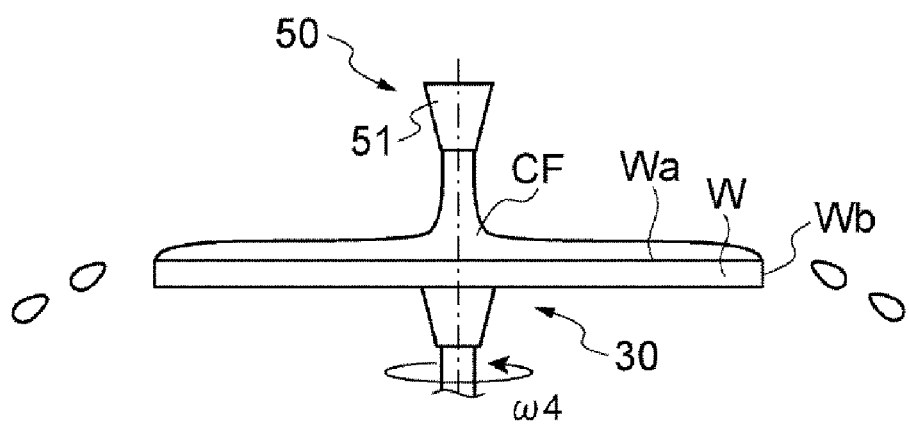
Figure 18C:
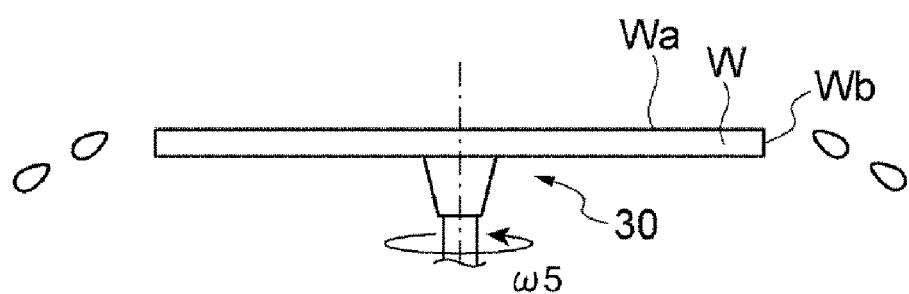

In the process S44, the cleaning and drying control unit 114 controls the rinse liquid supply unit 50 to start a supply of the rinse liquid CF (see FIG. 18A and FIG. 18B). For example, the cleaning and drying control unit 114 controls the rinse liquid supply unit 50 to start a supply of the rinse liquid CF from the tank 52 to the nozzle 51 by opening the valve 55 and start a discharge of the rinse liquid CF from the nozzle 51 to the surface Wa.

In the process S45, the cleaning and drying control unit 114 awaits a lapse of a fourth processing time. The fourth processing time is previously set in the condition setting or the like to sufficiently wash away the developing liquid DF and a dissolved material formed by the developing processing.

In the process S46, the cleaning and drying control unit 114 controls the rinse liquid supply unit 50 to stop the supply of the rinse liquid. By way of example, the cleaning and drying control unit 114 controls the rinse liquid supply unit 50 to stop the supply of the rinse liquid from the tank 52 to the nozzle 51 by closing the valve 55.

In the process S47, the cleaning and drying control unit 114 controls the rinse liquid supply unit 50 to retreat the nozzle 51 from above the wafer W by moving the nozzle 51 through the nozzle transfer device 56.

In the process S48, the cleaning and drying control unit 114 controls the rotating/holding unit 30 to change the rotation speed of the wafer W from the rotation speed ω4 to a rotation speed ω5 (fifth rotation speed). The rotation speed ω5 may be in a range from, by way of example, but not limitation, 1500 rpm to 2500 rpm.

In the process S49, the cleaning and drying control unit 114 awaits a lapse of a fifth processing time. The fifth processing time is previously set in the condition setting or the like to remove the residual liquid on the surface Wa sufficiently.

In the process S50, the cleaning and drying control unit 114 controls the rotating/holding unit 30 to stop the rotation of the wafer W. Then, the above-described developing processing, cleaning processing and drying processing are completed.

Effects of the Present Exemplary Embodiment

The coating and developing apparatus 2 includes the rotating/holding unit 30 configured to hold and rotate the wafer W; the rinse liquid supply unit 50 configured to supply the rinse liquid onto the surface Wa of the wafer W; the developing liquid supply unit 40 configured to supply the developing liquid onto the surface Wa; and the controller 100. The developing liquid supply unit 40 includes the nozzle 41 having the liquid contact surface 43 facing the surface Wa and the discharge hole 42 opened at the liquid contact surface 43 through which the developing liquid is discharged; and the nozzle transfer device 48 configured to adjust the position of the nozzle 41. The controller 100 is configured to control the rinse liquid supply unit 50 to supply the rinse liquid to the surface Wa and form the liquid puddle of the rinse liquid; control the developing liquid supply unit 40 to bring the liquid contact surface 43 into contact with the liquid puddle of the rinse liquid by moving the nozzle 41 through the nozzle transfer device 48 and to form the liquid puddle of the diluted developing liquid by discharging the developing liquid from the discharge hole 42; control the rotating/holding unit 30 to rotate the wafer W at the first rotation speed which allows the diluted developing liquid located at the inner side than the edge of the liquid contact surface 43 to stay between the liquid contact surface 43 and the surface Wa and the diluted developing liquid located at the outer side than the edge of the liquid contact surface 43 to be diffused toward the edge of the wafer W; control the rotating/holding unit 30 to rotate the wafer W at the second rotation speed lower than the first rotation speed after the wafer W is rotated at the first rotation speed; and control the developing liquid supply unit 40 to move the nozzle 41 toward the edge of the wafer W by the nozzle transfer device 48 while rotating the wafer W at the second rotation speed and discharging the developing liquid from the discharge hole 42.

On the surface Wa, the degree of the progression of the processing by the developing liquid tends to be increased at a portion where the developing liquid first reaches, as compared to other portions. In the coating and developing apparatus 2, however, prior to supplying the developing liquid, the liquid puddle of the diluted developing liquid is formed and the wafer W is rotated at the first rotation speed in the state that the liquid contact surface 43 is in contact with the liquid puddle of the diluted developing liquid. Accordingly, while the diluted developing liquid located at the inner side (hereinafter, referred to as "inner region") than the edge of the liquid contact surface 43 stays between the liquid contact surface 43 and the surface Wa, the diluted developing liquid located at the outer side (hereinafter, referred to as "outer region") than the edge of the liquid contact surface 43 is diffused toward the edge of the wafer W. As a result, a diluted developing liquid layer, whose thickness at the inner region is larger than at the outer region, is formed. The diluted developing liquid layer is degraded as time elapses. By way of example, as a film on the surface Wa is dissolved by the components of the developing liquid, the diluted developing liquid layer is turned to contain a dissolution product (dissolved material). The degraded diluted developing liquid layer hampers the progression of the processing by the developing liquid supplied afterwards. As stated above, as compared to the outer region, the thick diluted developing liquid layer exists at the inner region. Therefore, the progression of the processing at the portion (hereinafter, referred to as "initial arrival portion") where the developing liquid first reaches after the diluted developing liquid layer is formed is slowed down. Therefore, a difference between the degree of the progression of the processing at the initial arrival portion and the degree of the progression of the processing at the rest portion is reduced. Hence, non-uniformity in the degree of the progression of the processing (hereinafter, referred to as "processing progression degree") depending on the position on the wafer W can be suppressed.

The controlling of the developing liquid supply unit 40 such that the liquid contact surface 43 is brought into contact with the liquid puddle of the rinse liquid by moving the nozzle 41 through the nozzle transfer device 48 may include controlling the developing liquid supply unit 40 to move the nozzle 41 close to the surface Wa by the nozzle transfer device 48 in the state that the discharge hole 42 is filled with the developing liquid. In this case, by suppressing air bubbles from being mixed into the liquid puddle of the diluted developing liquid, the non-uniformity in the processing progression degree that might be caused by the air bubbles can be suppressed.

The controlling of the developing liquid supply unit 40 such that the nozzle 41 is moved close to the surface Wa in the state that the discharge hole 42 is filled with the developing liquid may include controlling the developing liquid supply unit 40 to move the nozzle 41 close to the surface Wa by the nozzle transfer device 48 while discharging the developing liquid from the discharge hole 42. In this case, after the liquid contact surface 43 is brought into contact with the rinse liquid, the developing liquid is immediately mixed into the rinse liquid. Accordingly, the formation of the liquid puddle of the diluted developing liquid is accelerated, so that the processing time can be shortened.

The controlling of the developing liquid supply unit 40 such that the nozzle 41 is moved close to the surface Wa of the wafer W while discharging the developing liquid from the discharge hole 42 may include controlling the developing liquid supply unit 40 to move the nozzle 41 close to the surface Wa until the distance between the liquid contact surface 43 and the surface Wa of the wafer W becomes 0.5 mm to 2 mm after the discharge of the developing liquid from the discharge hole 42 is begun in the state that the distance between the liquid contact surface 43 and the surface Wa of the wafer W ranges from 5 mm to 7 mm. In this case, the developing liquid can be suppressed from being dropped down until the liquid contact surface 43 comes into contact with the liquid puddle of the rinse liquid after the discharge of the developing liquid from the discharge hole 42 is begun. Accordingly, the progression of the processing by the dropped developing liquid can be suppressed, so that the non-uniformity in the processing progression degree that might be caused by this drop can be suppressed.

The second rotation speed may be in the range from 10 rpm to 100 rpm. In moving the nozzle 41 while discharging the developing liquid from the discharge hole 42, the developing liquid and the diluted developing liquid may be distributed in a spiral shape while being alternately arranged from the rotation center RC of the wafer W toward the edge thereof. In this case, a difference in the processing progression degree between a region in contact with the developing liquid and a region in contact with the diluted developing liquid is increased. By setting the second rotation speed to be equal to or higher than 10 rpm, however, the diffusion of the diluted developing liquid is accelerated, so that the formation of the spiral-shaped distribution of the developing liquid and the diluted developing liquid can be suppressed. Further, by setting the second rotation speed to be equal to or lower than 100 rpm, an excessive increase of the processing progression degree at the rotation center RC of the wafer W can be suppressed.

The controller 100 may be configured to further control the rotating/holding unit 30 to rotate the wafer W at the third rotation speed lower than the first rotation speed when the developing liquid supply unit 40 brings the liquid contact surface 43 into contact with the liquid puddle of the rinse liquid by moving the nozzle 41 through the nozzle transfer device 48 and discharges the developing liquid from the discharge hole 42.

The controlling of the developing liquid supply unit 40 such that the liquid contact surface 43 is brought into contact with the liquid puddle of the rinse liquid by moving the nozzle 41 through the nozzle transfer device 48 may include controlling the developing liquid supply unit 40 to bring the liquid contact surface 43 into contact with the liquid puddle of the rinse liquid at a position where the center of the liquid contact surface 43 is deviated from the rotation center of the wafer W. Further, the controlling of the developing liquid supply unit 40 such that the liquid puddle of the diluted developing liquid, which is the mixture of the rinse liquid and the developing liquid, is formed by discharging the developing liquid from the discharge hole 42 may include controlling the developing liquid supply unit 40 to move the center of the liquid contact surface 43 close to the rotation center of the wafer W by moving the nozzle 41 through the nozzle transfer device 48 while discharging the developing liquid from the discharge hole 42. In this case, immediately after the discharge of the developing liquid from the discharge hole 42 is begun, the developing liquid is spread in the rotation direction of the wafer W. Further, by moving the nozzle 41 toward the rotation center RC of the wafer W, the developing liquid is also spread in the diametrical direction (direction passing through the rotation center RC). Accordingly, it is possible to form the liquid puddle of the developing liquid, which has higher uniformity of concentration, so that the non-uniformity in the processing progression degree that might be caused by the non-uniformity in the concentration of the developing liquid can be suppressed.

The controlling of the developing liquid supply unit 40 such that the nozzle 41 is moved toward the edge of the wafer W by the nozzle transfer device 48 while rotating the wafer W at the second rotation speed and discharging the developing liquid from the discharge hole 42 may include controlling the developing liquid supply unit 40 such that the second rotation speed and the moving speed of the nozzle 41 satisfy the following expression.

$$3 \leq \omega 3/V \leq 5$$

Here, V denotes the moving speed [mm/s] of the nozzle 41, and ω3 stands for the second rotation speed [rpm].

By setting ω3/V to be equal to or larger than 3, the formation of the aforementioned spiral-shaped distribution can be suppressed. Further, by setting ω3/V to be equal to or smaller than 5, the excessive increase of the processing progression degree at the rotation center RC of the wafer W can be suppressed. Thus, the non-uniformity in the processing progression degree can be further suppressed.

The controlling of the developing liquid supply unit 40 such that the nozzle 41 is moved toward the edge of the wafer W by the nozzle transfer device 48 while rotating the wafer W at the second rotation speed and discharging the developing liquid from the discharge hole 42 may include controlling the developing liquid supply unit 40 to increase the discharge amount of the developing liquid from the discharge hole 42 while the nozzle 41 is being moved toward the edge of the wafer W. In this case, by setting the processing progression degree at the rotation center RC of the wafer W to be relatively small, the non-uniformity in the processing progression degree can be further suppressed.

[Modification Example of Developing Processing Sequence]

Subsequently, a modification example of the developing processing sequence will be explained. In this modification example, the pre-wet sequence and the developing liquid coating sequence in the above-described developing processing sequence are changed. Below, a pre-wet sequence and a developing liquid coating sequence according to the present modification example will be described.

<Pre-Wet Sequence>

The pre-wet sequence of the present modification example is different from the above-described pre-wet sequence in that the developing liquid supply unit 40 is controlled such that the center of the liquid contact surface 43 is moved close to the rotation center RC by moving the nozzle 41 through the nozzle transfer device 48 in a state that the discharge of the developing liquid from the discharge hole 42 is stopped after the developing liquid is discharged from the discharge hole 42.

Figure 19:
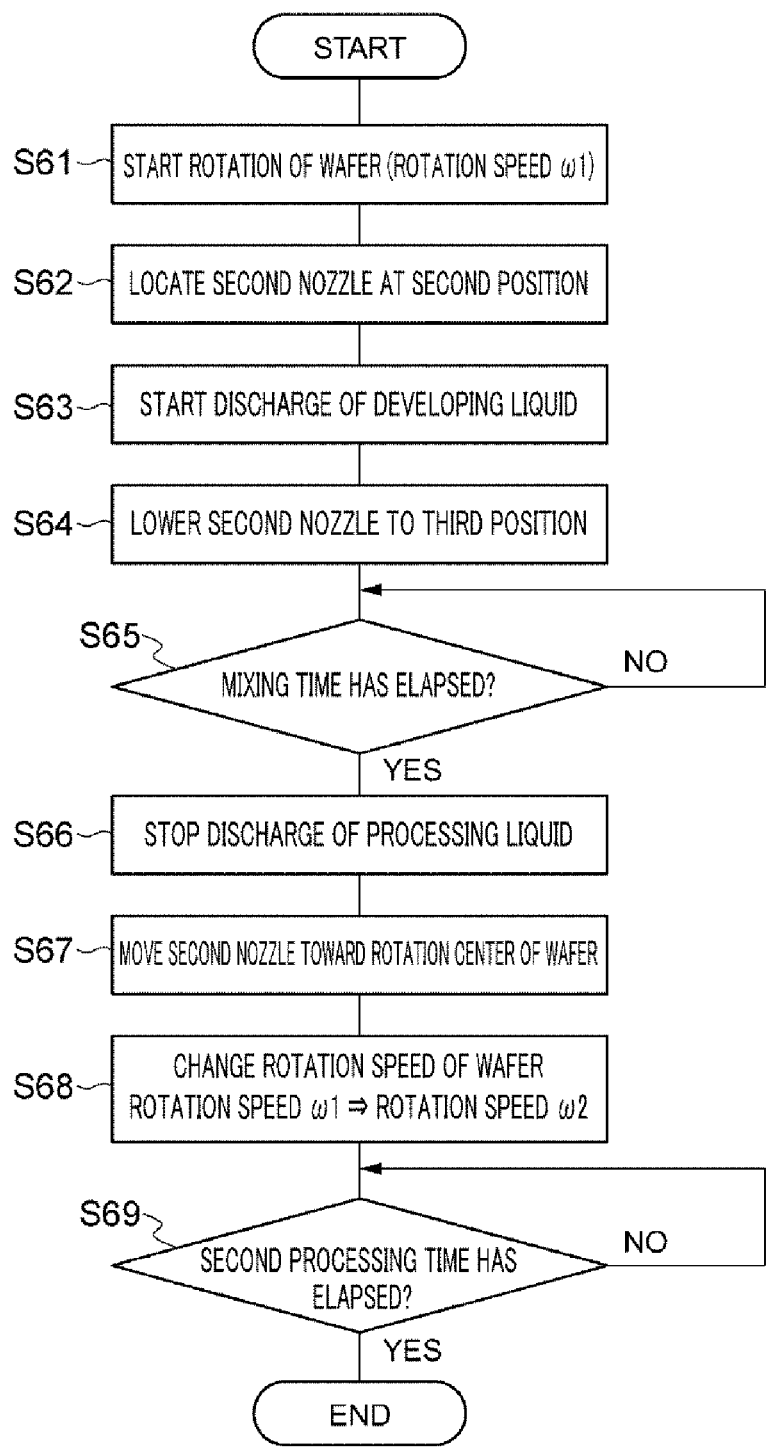
FIG. 19 is a flowchart for describing a modification example of the sequence of the pre-wet processing.

By way of example, as shown in FIG. 19, the pre-wet control unit 112 performs processes S61, S62, S63 and S64 which are the same as the processes S21, S22, S23 and S24, respectively. The process S61 includes controlling the rotating/holding unit 30 to start the rotation of the wafer W at the rotation speed ω1 (third rotation speed). The rotation speed ω1 may be, by way of example, 30 rpm to 60 rpm. The process S62 includes controlling the developing liquid supply unit 40 to move the nozzle 41 by the nozzle transfer device 48 and locate the nozzle 41 at the second position. The second position is set such that the distance D1 between the center of the liquid contact surface 43 and the rotation center RC is in a range from 10 mm to 40 mm. The process S63 includes controlling the developing liquid supply unit 40 to start the discharge of the developing liquid from the discharge hole 42. The discharge amount of the developing liquid after the discharge thereof is begun may be set to be in a range from, by way of example, 30 ml/min to 120 ml/min. The process S64 includes controlling the developing liquid supply unit 40 to lower the nozzle 41 to the aforementioned third position.

Subsequently, the pre-wet control unit 112 performs processes S65, S66 and S67 in sequence. The process S65 includes awaiting a lapse of a preset mixing time. By way of non-limiting example, this mixing time is set to be equal to or larger than a time length taken for the wafer W to rotate one round. The process S66 includes controlling the developing liquid supply unit 40 to stop the discharge of the developing liquid DF from the discharge hole 42. For instance, the pre-wet control unit 112 controls the developing liquid supply unit 40 to stop the supply of the developing liquid from the tank 44 to the nozzle 41 by closing the valve 47. The process S67 includes controlling the developing liquid supply unit 40 to bring the center of the liquid contact surface 43 close to the rotation center RC by moving the nozzle 41 through the nozzle transfer device 48. If the center of the liquid contact surface 43 reaches the rotation center RC, the pre-wet control unit 112 controls the developing liquid supply unit 40 to stop the movement of the nozzle 41 by the nozzle transfer device 48.

Further, in the processes S65, S66 and S67, the movement of the nozzle 41 is begun after the discharge of the developing liquid DF is stopped. However, the pre-wet control unit 112 may only need to control the developing liquid supply unit 40 such that the discharge of the developing liquid DF is stopped at least before the center of the liquid contact surface 43 reaches the rotation center RC. By way of example, the pre-wet control unit 112 may control the developing liquid supply unit 40 to start the movement of the nozzle 41 before stopping the discharge of the developing liquid DF and to stop the discharge of the developing liquid DF while the center of the liquid contact surface 43 is being moved to the rotation center RC.

Subsequently, the pre-wet control unit 112 performs processes S68 and S69 which are the same as the processes S27 and S28, respectively. The process S68 includes controlling the holding/rotating unit 30 to change the rotation speed of the wafer W from the rotation speed $\omega 1$ to the rotation speed $\omega 2$ (first rotation speed). The process S69 includes awaiting the lapse of the second processing time. Through these processes, the diluted developing liquid MF is coated on the surface Wa of the wafer W.

<Developing Liquid Coating Sequence>

The developing liquid coating sequence according to the present modification example is different from the above-described developing liquid coating sequence in that the developing liquid supply unit 40 is controlled such that the discharge of the developing liquid from the discharge hole 42 is begun while the center of the liquid contact surface 43 is away from the rotation center RC and is being moved toward the edge Wb of the wafer W.

Figure 20:
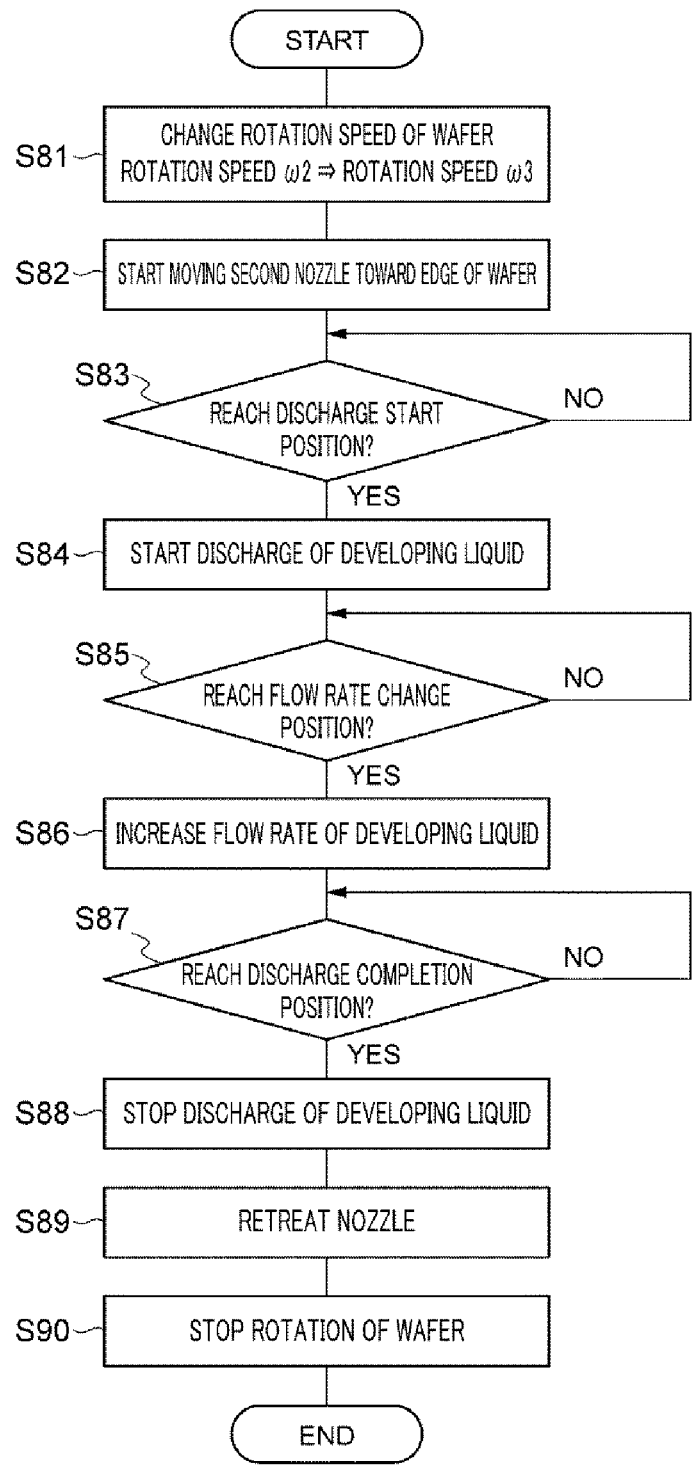
FIG. 20 is a flowchart for describing a modification example of the sequence of the coating processing.

By way of example, as shown in FIG. 20, the coating control unit 113 performs a process S81 which is the same as the process S31. The process S81 includes controlling the rotating/holding unit 30 to change the rotation speed of the wafer W from the rotation speed $\omega 2$ to the rotation speed $\omega 3$ (second rotation speed). The rotation speed $\omega 3$ may be in the range from, for example, 30 rpm to 60 rpm.

Subsequently, the coating control unit 113 performs processes S82, S83 and S84 in order. The process S82 includes, like the process S33, controlling the developing liquid supply unit 40 to start moving the nozzle 41 by the nozzle transfer device 48 toward the edge Wb. The process S83 includes waiting for the nozzle 41 to reach a preset discharge start position. The discharge start position is set such that the distance between the center of the liquid contact surface 43 and the rotation center RC is in a range from, for example, 10 mm to 40 mm. The process S84 includes, like the process S32, controlling the developing liquid supply unit 40 to start the discharge of the developing liquid DF from the discharge hole 42. The discharge amount of the developing liquid DF after the discharge thereof is begun is, for example, 70 ml/min to 150 ml/min.

Then, the coating control unit 113 performs processes S85, S86, S87, S88, S89 and S90 in order, which are the same as the processes S34, S35, S36, S37, S38 and S39, respectively. The process S85 includes waiting for the nozzle 41 to reach the flow rate change position. The process S86 includes controlling the developing liquid supply unit 40 to increase the discharge amount of the developing liquid from the discharge hole 42. The process S87 includes waiting for the nozzle 41 to reach the discharge completion position. The process S88 includes controlling the developing liquid supply unit 40 to stop the discharge of the developing liquid DF from the discharge hole 42. The process S89 includes controlling the developing liquid supply unit 40 to retreat the nozzle 41 from above the wafer W by moving the nozzle 41 through the nozzle transfer device 48. The process S90 includes controlling the holding/rotating unit 30 to stop the rotation of the wafer W. Through these processes, the liquid film PD3 of the developing liquid DF is formed on the surface Wa. The coating control unit 113 may not change the discharge amount of the developing liquid from the discharge hole 42. That is, the processes S85 and S86 may be omitted.

Under the condition in which the amount of the dissolution product, caused by the developing processing, is reduced such as when a trench interval of a resist pattern is large or the like, the degradation of the aforementioned diluted developing liquid layer is delayed. Accordingly, since the effect of the diluted developing liquid layer that allows the progression of the processing to be slowed down is reduced, the processing may progress excessively especially in the vicinity of the rotation center RC of the wafer W. To the contrary, according to the present modification example, since the developing liquid is not discharged at the rotation center RC, the progression of the processing in the vicinity of the rotation center RC can be suppressed.

In the above, the exemplary embodiments has been described. However, the exemplary embodiments are not limiting, and various changes and modifications may be made without departing from the scope of the present disclosure. The processing target substrate is not limited to the semiconductor wafer but may be, for example, a glass substrate, a mask substrate, a FPD (Flat Panel Display), or the like.

EXPERIMENTAL EXAMPLES

Now, experimental examples and comparative example of the developing processing sequence will be described. However, it should be noted that the present disclosure is not limited to the examples.

Experimental Example 1

A wafer W having a diameter of 300 mm is prepared, and a positive type resist film is formed on a surface Wa thereof. Then, the exposure processing is performed on the resist film by a step and repeat method. An exposure condition in each shot is set to form line-shaped patterns having a width of about 150 nm at a regular distance. Thereafter, parameters are set as follows, and the developing processing described in the above exemplary embodiment is performed by using the positive type developing liquid. Pure water is used as the rinse liquid.

First processing time: 10 s
Pure water discharge amount: 40 ml
Rotation speed $\omega 1$: 40 rpm
Second position: 15 mm from the rotation center RC with a distance of 10 mm between the liquid contact surface 43 and the surface Wa
Third position: 15 mm from the rotation center RC with a distance of 1 mm between the liquid contact surface 43 and the surface Wa Rotation speed ω2: 1000 rpm
Second processing time: 1 s
Second rotation speed: 40 rpm
Discharge amount of the developing liquid after the process S32 and before the process S35: 30 ml/min
Moving speed of the nozzle 41 after the process S33: 10 mm/s
Flow rate change position: 30 mm from the rotation center RC Discharge amount of the developing liquid after the process S35: 90 ml/min
Third processing time: 3 s
Rotation speed ω4: 1000 rpm
Fourth processing time: 15 s
Rotation speed ω5: 2000 rpm
Fifth processing time: 15 s Comparative Example A wafer W having a diameter of 300 mm is prepared, and a positive type resist film is formed on a surface Wa thereof. Then, the exposure processing is performed on the resist film to obtain a target line width of 150 nm. Then, the developing processing is performed by changing the conditions of the experimental example 1 as follows. That is, in the state that the liquid contact surface 43 is distanced away from the liquid puddle of the diluted developing liquid, the processes S27 and S28 of widely spreading the diluted developing liquid are performed, and, then, the subsequent sequences are performed after returning the distance between the liquid contact surface 43 and the surface Wa to 1 mm.

Experimental Example 2

The developing processing is performed under the same conditions as those of the experimental example 1 except the following.
i) The nozzle 41 has the multiple discharge holes 42 arranged in the circumferential direction around the center of the liquid contact surface 43 and inclined in the same direction with respect to the circumferential direction.
ii) Under the condition that the discharge amount of the developing liquid DF is 90 ml/min, the average flow velocity of the developing liquid DF passing through the liquid contact surface 43 is 21.7 m/min.
iii) The discharge amount of the developing liquid after the process S32 and before the process S35 is 90 ml/min.

Experimental Example 3

The developing processing is performed under the same conditions as those of the experimental example 2 except the following.
ii) Under the condition that the discharge amount of the developing liquid DF is 90 ml/min, the average flow velocity of the developing liquid DF passing through the liquid contact surface 43 is 3.5 m/min.

Experimental Example 4

The developing processing is performed under the same conditions as those of the experimental example 2 except the following.
i) The nozzle 41 has the single discharge hole 42 which passes through the center of the liquid contact surface 43.
ii) Under the condition that the discharge amount of the developing liquid DF is 90 ml/min, the average flow velocity of the developing liquid DF passing through the liquid contact surface 43 is 2.3 m/min.

[Evaluation of Non-Uniformity in Line Width Between Shots]

As for the resist patterns formed by the experimental examples and the comparative example, nine measurement points are set for each shot, and a line width is measured at each measurement point. For each of the nine measurement points, an average value of line width measurement values (line width measurement results) of all shots is calculated. Hereinafter, the average value obtained for each of the nine measurement points will be referred to as "reference value." For each shot, a difference between the line width measurement value at each of the nine measurement points and the reference value at each of the nine measurement points is calculated. Hereinafter, the difference between the line width measurement value and the reference value will be referred to as "difference value." A standard deviation is calculated for a population of data group obtained by calculating an average value of the difference values at the nine measurement points for each shot, and a value equivalent to three times the standard deviation is set as a first non-uniformity evaluation value.

[Evaluation of Non-Uniformity in Line Width in a Single Shot]

As for the resist patterns formed by the experimental examples and the comparative example, nine measurement points are set for each shot, and a line width is measured at each measurement point. The reference value as stated above is calculated for each of the nine measurement points, and the difference values at the nine measurement points are calculated for each shot. Then, the standard deviations of the difference values at the nine measurement points are calculated for each shot, and a value equivalent to three times the standard deviation is set as a second non-uniformity evaluation value.

[Comparison Result of Non-Uniformity Evaluation Values]

The wafer W of the experimental example 1 has the first non-uniformity evaluation value about 28% smaller than that of the wafer W of the comparative example and the second non-uniformity evaluation value about 22% smaller than that of the wafer W of the comparative example. From this result, it is found out that the non-uniformity in the processing progression degree is reduced by performing, prior to supplying the developing liquid, the process of spreading the diluted developing liquid widely in the state that the liquid contact surface 43 is in contact with the liquid puddle of the diluted developing liquid The wafer W of the experimental example 3 has the first non-uniformity evaluation value about 30% smaller than that of the wafer W of the experimental example 2, and there is found that no big difference between the second non-uniformity evaluation values of the two wafers W. From this result, it is found out that the non-uniformity in the processing progression degree is reduced by controlling the nozzle 41 such that the average flow velocity of the developing liquid DF passing through the liquid contact surface 43 is changed from 21.7 m/min to 3.5 m/min.

The wafer W of the experimental example 4 is found to have the first non-uniformity evaluation value about 10% smaller than that of the wafer W of the experimental example 3. This result indicates that the non-uniformity in the line width between the shots can be further reduced by further reducing the average flow velocity of the developing liquid DF passing through the liquid contact surface 43 from 3.5 m/min to 2.3 m/min.

Meanwhile, the wafer W of the experimental example 4 is found to have the second non-uniformity evaluation value about 10% larger than that of the wafer W of the experimental example 3. From this result, it is found out that the structure of the nozzle 41 used in the experimental examples 2 and 3 (that is, the structure having the multiple discharge holes 42 arranged in the circumferential direction around the center of the liquid contact surface 43 and inclined in the same direction with respect to the circumferential direction) has advantages in reducing the non-uniformity of the line width within the single shot.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate processing method, comprising:
supplying a diluting liquid on a surface of a substrate and forming a liquid puddle of the diluting liquid;
bringing, by moving a nozzle having a liquid contact surface facing the surface of the substrate and a discharge hole which is opened at the liquid contact surface and through which a processing liquid is discharged, the liquid contact surface into contact with the liquid puddle of the diluting liquid, and forming a liquid puddle of a mixed solution of the diluting liquid and the processing liquid by discharging the processing liquid from the discharge hole;
rotating the substrate at a first rotation speed which allows the mixed solution located at a region facing an inner side than an edge of the liquid contact surface to stay between the liquid contact surface and the surface of the substrate and allows the mixed solution located at a region facing an outer side than the edge of the liquid contact surface to be diffused toward an edge of the substrate;
rotating the substrate at a second rotation speed smaller than the first rotation speed after the substrate is rotated at the first rotation speed; and
moving the nozzle toward the edge of the substrate while discharging the processing liquid from the discharge hole in a state that the substrate is rotated at the second rotation speed,
wherein the bringing of the liquid contact surface includes:
moving the nozzle close to the surface of the substrate in a state that the discharge hole is filled with the processing liquid,
wherein the moving of the nozzle close to the surface of the substrate includes:
moving the nozzle close to the surface of the substrate while discharging the processing liquid from the discharge hole,
wherein the moving of the nozzle close to the surface of the substrate while discharging the processing liquid from the discharge hole includes:
moving the nozzle close to the surface of the substrate until a distance between the liquid contact surface and the surface of the substrate becomes 0.5 mm to 2 mm, after the discharging of the processing liquid from the discharge hole is begun in a state that the nozzle is moved and the distance between the liquid contact surface and the surface of the substrate has been 5 mm to 7 mm.

2. The substrate processing method of claim 1, wherein the first rotation speed is in a range from 300 rpm to 1500 rpm.

3. The substrate processing method of claim 1, wherein the second rotation speed is in a range from 10 rpm to 100 rpm.

4. The substrate processing method of claim 1, further comprising:
rotating the substrate at a third rotation speed smaller than the first rotation speed when the liquid contact surface is brought into contact with the liquid puddle of the diluting liquid by moving the nozzle and discharging the processing liquid from the discharge hole.

5. The substrate processing method of claim 4, wherein the bringing of the liquid contact surface includes:
bringing the liquid contact surface into contact with the liquid puddle of the diluting liquid at a position where a center of the liquid contact surface is deviated from a rotation center of the substrate, and
the forming of the liquid puddle of the mixed solution of the diluting liquid and the processing liquid includes:
moving the center of the liquid contact surface close to the rotation center of the substrate by moving the nozzle while discharging the processing liquid from the discharge hole.

6. The substrate processing method of claim 4, wherein the third rotation speed is equal to or less than 100 rpm.

7. The substrate processing method of claim 1, wherein the moving of the nozzle toward the edge of the substrate includes:
allowing the second rotation speed and a moving speed of the nozzle to satisfy a following expression:

$$3 \leq RF/V \leq 5$$

(V denotes the moving speed [mm/s] of the nozzle and RF denotes the second rotation speed [rpm]).

8. The substrate processing method of claim 1, wherein the nozzle is configured such that an average flow velocity of the processing liquid passing through the liquid contact surface is in a range from 1.2 m/min to 5.5 m/min under a condition that a discharge amount of the processing liquid is set to be 90 ml/min.

9. The substrate processing method of claim 8, wherein the nozzle has multiple discharge holes arranged in a circumferential direction around a center of the liquid contact surface and inclined in a same direction with respect to the circumferential direction.

10. The substrate processing method of claim 8,
wherein an opening area of the discharge hole is gradually increased as it approaches the liquid contact surface.

11. The substrate processing method of claim 8,
wherein the moving of the nozzle toward the edge of the substrate includes:
allowing the average flow velocity of the processing liquid passing through the liquid contact surface to be in the range from 1.2 m/min to 5.5 m/min when the discharging of the processing liquid from the discharge hole is begun.

12. The substrate processing method of claim 4,
wherein the forming of the liquid puddle of the mixed solution of the diluting liquid and the processing liquid includes:
moving a center of the liquid contact surface close to a rotation center of the substrate by moving the nozzle in a state that the discharging of the processing liquid from the discharge hole is stopped after discharging the processing liquid from the discharge hole.

13. The substrate processing method of claim 12,
wherein the moving of the nozzle toward the edge of the substrate includes:
starting the discharging of the processing liquid from the discharge hole while the center of the liquid contact surface is away from the rotation center of the substrate and is being moved toward the edge thereof.

14. A substrate processing method, comprising:
supplying a diluting liquid on a surface of a substrate and forming a liquid puddle of the diluting liquid;
bringing, by moving a nozzle having a liquid contact surface facing the surface of the substrate and a discharge hole which is opened at the liquid contact surface and through which a processing liquid is discharged, the liquid contact surface into contact with the liquid puddle of the diluting liquid, and forming a liquid puddle of a mixed solution of the diluting liquid and the processing liquid by discharging the processing liquid from the discharge hole;
rotating the substrate at a first rotation speed which allows the mixed solution located at a region facing an inner side than an edge of the liquid contact surface to stay between the liquid contact surface and the surface of the substrate and allows the mixed solution located at a region facing an outer side than the edge of the liquid contact surface to be diffused toward an edge of the substrate;
rotating the substrate at a second rotation speed smaller than the first rotation speed after the substrate is rotated at the first rotation speed; and
moving the nozzle toward the edge of the substrate while discharging the processing liquid from the discharge hole in a state that the substrate is rotated at the second rotation speed,
wherein the moving of the nozzle toward the edge of the substrate includes:
increasing a discharge amount of the processing liquid from the discharge hole while the nozzle is being moved toward the edge of the substrate.

15. The substrate processing method of claim 14,
wherein the nozzle is configured such that an average flow velocity of the processing liquid passing through the liquid contact surface is in a range from 1.2 m/min to 5.5 m/min under a condition that a discharge amount of the processing liquid is set to be 90 ml/min.

16. The substrate processing method of claim 15,
wherein the nozzle has multiple discharge holes arranged in a circumferential direction around a center of the liquid contact surface and inclined in a same direction with respect to the circumferential direction.

17. The substrate processing method of claim 15,
wherein an opening area of the discharge hole is gradually increased as it approaches the liquid contact surface.

18. The substrate processing method of claim 15,
wherein the moving of the nozzle toward the edge of the substrate includes:
allowing the average flow velocity of the processing liquid passing through the liquid contact surface to be in the range from 1.2 m/min to 5.5 m/min when the discharging of the processing liquid from the discharge hole is begun.

* * * * *